United States Patent
Devine et al.

(10) Patent No.: US 7,045,746 B2
(45) Date of Patent: May 16, 2006

(54) SHADOW-FREE SHUTTER ARRANGEMENT AND METHOD

(75) Inventors: Daniel J. Devine, Los Gatos, CA (US); Young Jai Lee, Sunnyvale, CA (US); Paul J. Timans, Mountain View, CA (US); Frank Allan Lema, San Jose, CA (US)

(73) Assignee: Mattson Technology, Inc., Fremont, CA (US)

( * ) Notice: Subject to any disclaimer, the term of this patent is extended or adjusted under 35 U.S.C. 154(b) by 0 days.

(21) Appl. No.: 10/706,367

(22) Filed: Nov. 12, 2003

(65) Prior Publication Data

US 2005/0098553 A1 May 12, 2005

(51) Int. Cl.
*F27D 11/00* (2006.01)

(52) U.S. Cl. ............ 219/411; 219/390; 219/405; 219/416; 392/416; 392/418; 118/724; 118/725; 118/50.1

(58) Field of Classification Search ............ 219/390, 219/405, 411, 416; 392/416, 418; 118/724, 118/725, 50.1
See application file for complete search history.

(56) References Cited

U.S. PATENT DOCUMENTS

| | | | |
|---|---|---|---|
| 5,060,354 | A | 10/1991 | Chizinsky |
| 5,155,336 | A | 10/1992 | Gronet et al. |
| 5,252,807 | A | 10/1993 | Chizinsky |
| 5,520,742 | A | 5/1996 | Ohkase |
| 6,054,684 | A * | 4/2000 | Pas et al. ............ 219/390 |
| 6,173,116 | B1 | 1/2001 | Roozeboom et al. |
| 6,209,220 | B1 | 4/2001 | Raaijmakers |
| 6,215,106 | B1 | 4/2001 | Boas et al. |
| 6,259,062 | B1 | 7/2001 | Pan |
| 6,410,888 | B1 | 6/2002 | Pan |
| 6,460,369 | B1 | 10/2002 | Hosokawa |

(Continued)

FOREIGN PATENT DOCUMENTS

DE    4142466    12/1991

(Continued)

OTHER PUBLICATIONS

Lee et al, A. Novel Illuminator Design in a Rapid Thermal Processor, May 2001, IEEE Transactions on Semiconductor Manufacturing, vol. 14, No. 2, pp 152-156.

(Continued)

*Primary Examiner*—Shawntina Fuqua
(74) *Attorney, Agent, or Firm*—Michael Pritzkau

(57) ABSTRACT

As part of a system for processing a workpiece by applying a controlled heat to the workpiece, a heating arrangement includes an array of spaced apart heating elements for use in a confronting relationship with the workpiece to subject the workpiece to a direct radiation that is produced. A radiation shield includes a plurality of members supported for movement between (i) retracted positions, which allow the direct radiation to reach the workpiece, and (ii) extended positions, in which the plurality of members cooperate in way which serves to at least partially block the direct radiation from reaching the workpiece and to absorb radiation emitted and reflected by the workpiece and thereby achieve greater control of the time-temperature profile than previously obtainable. At least certain ones of the members move between adjacent ones of the heating elements in moving those certain members between the retracted and extended positions. Tubular, curved and plate-like member configurations can be used.

79 Claims, 19 Drawing Sheets

U.S. PATENT DOCUMENTS

| | | |
|---|---|---|
| 6,474,986 B1 | 11/2002 | Oda et al. |
| 6,706,643 B1 | 3/2004 | Tay et al. |
| 6,707,011 B1 | 3/2004 | Tay et al. |
| 2003/0193987 A1 | 10/2003 | Zalameda et al. |

FOREIGN PATENT DOCUMENTS

| | | |
|---|---|---|
| JP | 59 253455 | 11/1984 |
| WO | WO 00/31777 | 6/2000 |
| WO | WO 01/13054 A1 | 2/2001 |

OTHER PUBLICATIONS

Yokota et al, Halogen and Mercury Lamp Annealing of Cd-Implanted GaAs, Nov. 1989, J. Electrochem Soc., vol. 136, No 11, pp 3450-3454.

Katz et al, On Rapid Thermal Processing with Quenching Under Controlled Ambient or Vacuum Conditions, Jan. 1989, J Vac Sci Technol, B 7 (1), pp 130-132.

* cited by examiner

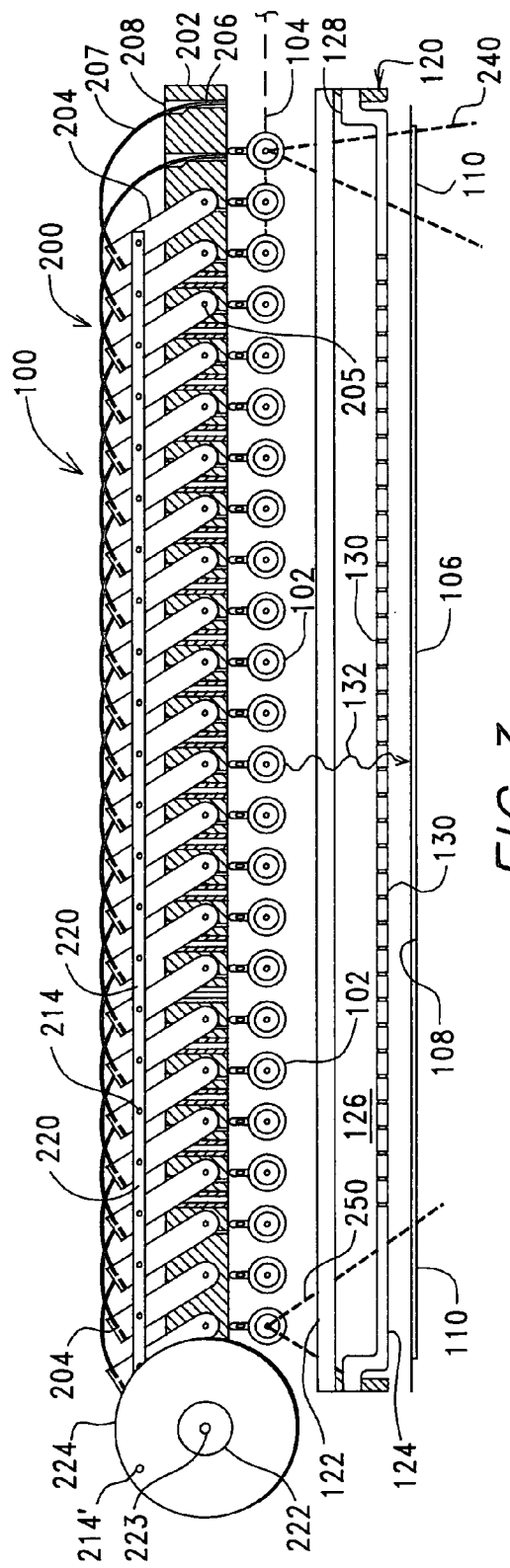
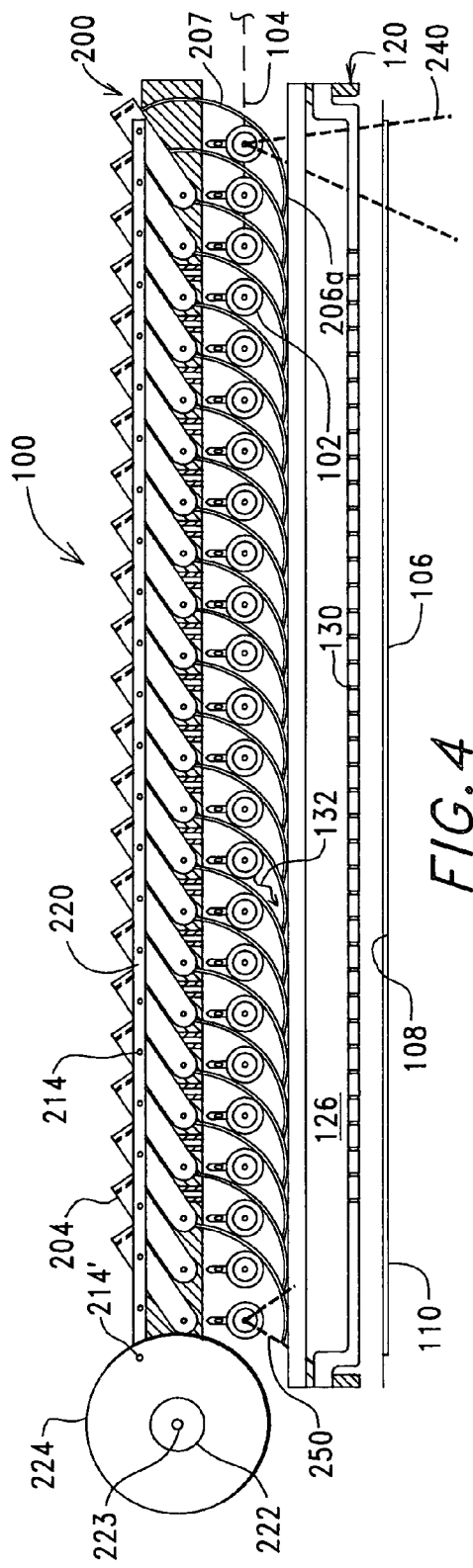
FIG. 3
FIG. 4

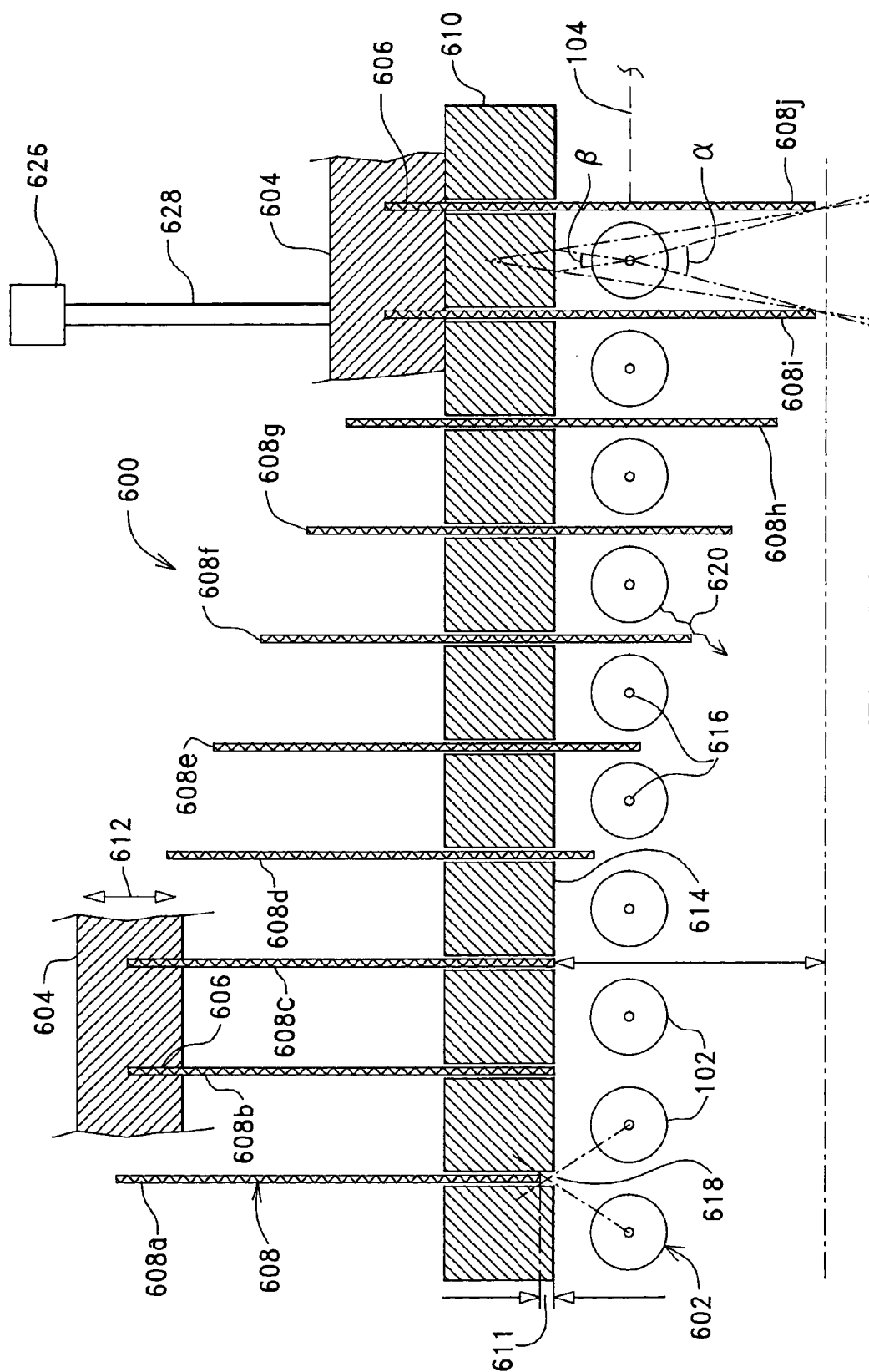

SHADOW-FREE SHUTTER ARRANGEMENT AND METHOD

BACKGROUND OF THE INVENTION

The present invention is related generally to the field of Rapid Thermal Processing (RTP) of a workpiece and, more particularly, to a radiation shield including a plurality of segments for use in applying controlled heat to the workpiece.

In the production of devices including, but not limited to semiconductors, optoelectronic devices, flat panel displays and MEMS (Micro Electro-Mechanical Systems), at least some processing steps may require the application of controlled heat. For example, in the instance of semiconductors, certain processing steps require the application of heat to wafers and other such workpieces to accomplish annealing. In particular, ion implantation is often used to introduce a dopant in selected areas of a wafer. An RTP anneal is thereafter applied, since the ion implantation process damages the crystal lattice structure of the exposed, selected areas of the wafer, leaving the implanted dopant atoms in interstitial sites where they are electrically inactive. Annealing serves to move the dopant atoms into substitutional sites in the lattice to render them electrically active, and to repair the damage to the crystal lattice structure that occurs during ion implantation.

Unfortunately, annealing the device side of a semiconductor wafer can produce undesirable effects in the absence of precision control. At high temperatures, dopant atoms may diffuse into the wafer at much higher rates, with most of the diffusion occurring at the peak annealing temperature that is required to activate the dopants. With increasing performance demands for semiconductor wafers and decreasing device sizes, it is necessary to produce increasingly shallow and abruptly defined junctions. In order to accommodate these demands and ever smaller device sizes, it is desirable to control a wafer anneal heating profile as precisely as possible in a way which subjects the wafer to temperature conditions which serve to activate the dopants while, at the same time, limiting diffusion of the dopants.

One well-known configuration for use in implementing a rapid annealing process, in a single wafer approach, utilizes heating elements which generate radiation to which a wafer is directly subjected. One possible implementation of this approach is shown as FIG. 3a of U.S. Pat. No. 6,054,684, issued to Pas, et al. (hereinafter Pas) which is repeated as FIG. 1 of the present application, having alternative reference numbers applied thereto. A heat processing arrangement, generally illustrated by the reference numeral 10, includes a wafer holder 12 and heaters 14. The latter may be comprised of resistive heating elements or lamps. A shutter system 16 is positioned between heaters 14 and a wafer (not shown) supportable on wafer holder 12. Shutters 16 are provided for selectively blocking energy from heaters 14 from reaching the wafer.

As is recognized by Pas, the described configuration is problematic since the interposition of the shutter system, between the wafer and heating elements, produces shadowing on the wafer with the shutters in their open position. The result of such shadowing is non-uniform heating of the wafer surface.

While Pas attempts to reduce the shadowing problem by suggesting the use of reflective coatings on the shutters, the overall configuration is considered as unacceptable in view of the teachings of the present invention. Specifically, it is submitted that this shadowing results in shadowed device areas which would be under-annealed as a result of exposure to only indirect radiation from heaters 14. Increasing exposure time in order to properly heat treat the shadowed areas is likely to produce excessive dopant diffusion problems in areas of a wafer that are directly exposed to the heaters.

It is of interest that FIG. 3 of U.S. Pat. No. 6,259,062, issued to Pan, and repeated here as FIG. 2, having alternative reference numbers applied thereto, includes a remarkably similar arrangement to that of Pas. Pan describes a system, generally indicated by the reference number 30 in which a wafer 32 is supported on a pedestal 33 in a process chamber 34 so that the wafer may be exposed to a plurality of heating sources 36 such as radiant heat lamps that are arranged above and below the wafer. As is common practice in the prior art, a reflective surface 38 is positioned outward of the heat lamps. Rather than using shutters like Pas, however, two radiation absorbing material members 40 are translationally movable in directions indicated by double-headed arrows 42 such that material 40 may be slidably interposed between lamps 36 and wafer 32 (both above and below the wafer) or moved laterally out of the region which lies directly between lamps 36 and wafer 32 (see FIGS. 1 and 2 of Pan). It is important to understand, however, that the Pan patent is directed to using heat absorbing medium 40 in post-process cooling of wafer 32 for purposes of improving system throughput. That is, the patent appears to be narrowly tailored to cooling the wafer following completion of processing. To that end, medium 40 slides into position between the wafer and reflective surface 38, both above and below the wafer, after processing is complete so as to absorb radiant heat 44 from the wafer in order to more rapidly cool the wafer for removal. System throughput may be enhanced, for example, since a heat sensitive robot arm is sooner able to pick up the cooled wafer. In this regard, it is noted that FIG. 2 clearly represents a post-process condition since no heat is shown emanating from heating sources 36.

While the arrangement of Pan does not exhibit the shadowing problem of the shutter arrangement of Pas, it is submitted that another important problem would be introduced in any attempt to use this configuration in the context of Pas, or generally as part of a rapid thermal process, as will be discussed immediately hereinafter.

Still referring to FIG. 2, implementation of a heating profile that is controlled, at least in part, using medium 40 would be problematic for a particular reason. Specifically, it is recognized herein, as will be further described, that the act of translationally moving medium 40 to an interposed position would progressively block direct radiation between lamps 36 and wafer 40. If actual processing were underway, with the lamps emitting radiation, the wafer would be highly non-symmetrically exposed to radiation, resulting in unpredictable and unacceptable consequences insofar as RTP contemplated by the present invention. Again, however, it is noted that Pan appears to be narrowly tailored to its stated post-process purpose.

The present invention provides a highly advantageous apparatus and method which are submitted to resolve the foregoing difficulties and problems while providing still further advantages.

SUMMARY OF THE INVENTION

In a system for processing a workpiece by applying controlled heat thereto, an apparatus and method are described. In one aspect of the present invention, a heating arrangement defines a heating plane for use in a confronting relationship with the workpiece to subject the workpiece to a direct radiation that is produced by the heating arrangement. A segmented radiation shield includes a plurality of segments supported for movement between (i) retracted or open positions, in which said direct radiation is allowed to reach said workpiece, and (ii) extended positions, in which extended or closed positions the plurality of segments cooperate in way which serves to at least partially block the direct radiation from reaching the workpiece. Movement means moves the plurality of segments between the retracted positions and the extended positions. In one feature, the movement means includes means for providing a controlled acceleration and deceleration of the segments moving between the retracted positions and the extended positions.

In another aspect of the present invention, a plurality of elongated heating elements are arranged in a confronting relationship with a workpiece for use in subjecting the workpiece to a radiation that is produced by the heating elements. A support arrangement defines at least one surface for supporting the plurality of elongated heating elements adjacent to one another in a side-by-side relationship. A plurality of elongated shutter members, hingedly supported by the support arrangement, are at least generally aligned with the elongated heating elements, and are movable between a retracted position in which the shutter members allow the radiation to impinge directly upon the workpiece from the heating elements and an extended position such that the shutter members move outward from the surface, beginning from the retracted position, to be interposed between the heating elements and the workpiece, in the extended position, in a way which serves to prevent at least a portion of the radiation from directly reaching the workpiece. Movement means moves the elongated shutter members between the retracted positions and the extended positions.

In still another aspect of the present invention, a heating arrangement is provided for use in a confronting relationship with the workpiece to subject the workpiece to a direct radiation that is produced by the heating arrangement. A radiation shield is supported for pivotal movement between (i) a retracted position, at least partially on a side of the heating arrangement that is opposite from the workpiece to allow the direct radiation to reach the workpiece, and (ii) an extended position, between the heating arrangement and the workpiece, in which extended position the radiation shield serves to at least partially block at least a portion of the direct radiation from reaching the workpiece.

In a further aspect of the present invention, a heating arrangement includes an array of spaced apart heating elements for use in a confronting relationship with the workpiece to subject the workpiece to a direct radiation that is produced by the heating arrangement. A segmented radiation shield includes a plurality of segments supported for movement between (i) retracted positions, which allow the direct radiation to reach the workpiece, and (ii) extended positions, in which extended positions the plurality of segments cooperate in way which serves to at least partially block at least a portion of the direct radiation from reaching the workpiece and configured for moving at least certain ones of the segments of the radiation shield between adjacent ones of the heating elements in moving those certain segments between the retracted and extended positions.

In a continuing aspect of the present invention, a system and method are described for processing a workpiece by applying controlled heat thereto. The system includes an apparatus having a heating arrangement for use in a confronting relationship with a treatment width of the workpiece to subject the workpiece to a direct radiation that is produced by the heating arrangement. A radiation shield is supported for movement between (i) a retracted state to allow the direct radiation to reach the workpiece without producing shadowing thereon, and (ii) an extended state in which the radiation shield serves to at least partially block at least a portion of the direct radiation from reaching the workpiece such that the radiation shield moves a distance between the retracted state and the extended state which is less than the treatment width.

In another aspect of the present invention, as part of a system for processing a workpiece, having a treatment width, by applying controlled heat thereto, an apparatus and method are described including a heating arrangement for use in a confronting relationship with the treatment width of the workpiece to subject the workpiece to a direct radiation that is produced by the heating arrangement. A radiation shield, including a plurality of members, is supported for movement between (i) a retracted state to allow the direct radiation to reach the workpiece without producing shadowing thereon, and (ii) an extended state in which the radiation shield serves to at least partially block at least a portion of the direct radiation from reaching the workpiece such that each of the members moves a distance between the open state and the extended state which is less than the treatment width.

In another aspect of the present invention, as part of a system for processing a workpiece by applying controlled heat thereto, an apparatus and method are described in which a heating arrangement is used in a confronting relationship with the workpiece to subject the workpiece to a direct radiation that is produced by the heating arrangement. The heating arrangement includes a plurality of spaced apart heating elements. A radiation shield includes a plurality of shield members that are supported for movement between (i) an open state to allow the direct radiation to reach the workpiece without producing shadowing thereon, and (ii) an extended state in which the shield members serve to at least partially block the direct radiation from reaching the workpiece such that the shield members move at least between adjacent ones of the heating elements. Means is provided for moving the shield members between the open state and the extended state.

In a further aspect of the present invention, a linear movement embodiment is described in which only linear shutter movement is needed. In one feature, planar plate-like shutters are used. In another feature, tubular shutters are used.

BRIEF DESCRIPTION OF THE DRAWINGS

The present invention may be understood by reference to the following detailed description taken in conjunction with the drawings briefly described below.

FIG. 3 is a diagrammatic view, in elevation, of an RTP system including a shutter arrangement that is produced in accordance with the present invention, shown here to illustrate details of its highly advantageous structure having its shutters in an open, retracted position.

FIG. 4 is a diagrammatic view, in elevation, of the RTP system of FIG. 3 including the shutter arrangement of the present invention, having its shutters in a closed, extended position.

FIG. 20 is a diagrammatic partially cut-away view, in elevation, of yet another embodiment of the shutter arrangement of the present invention, shown here to illustrate details of its highly advantageous structure having planar, linear motion shutter members shown in a progression of positions ranging from retracted to extended.

DETAILED DESCRIPTION OF THE INVENTION

The following description is presented to enable one of ordinary skill in the art to make and use the invention and is provided in the context of a patent application and its requirements. Various modifications to the described embodiments will be readily apparent to those skilled in the art and the generic principles herein may be applied to other embodiments. Thus, the present invention is not intended to be limited to the embodiment shown but is to be accorded the widest scope consistent with the principles and features described herein.

Figure 1:
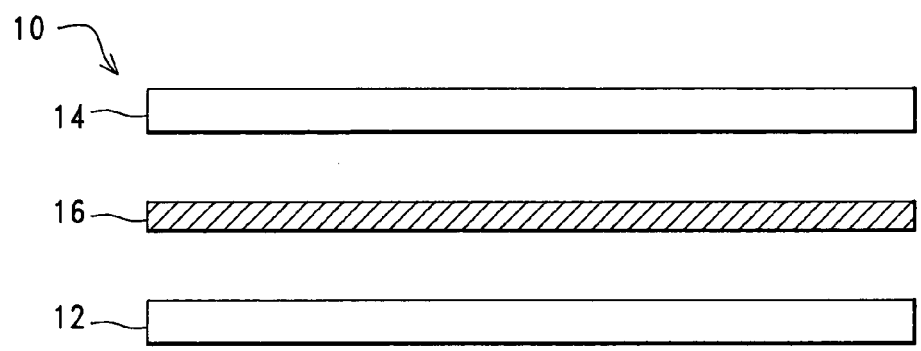
FIG. 1 is taken directly from FIG. 3a of U.S. Pat. No. 6,054,684, repeated here for purposes of discussing one prior art shutter implementation.
Figure 2:
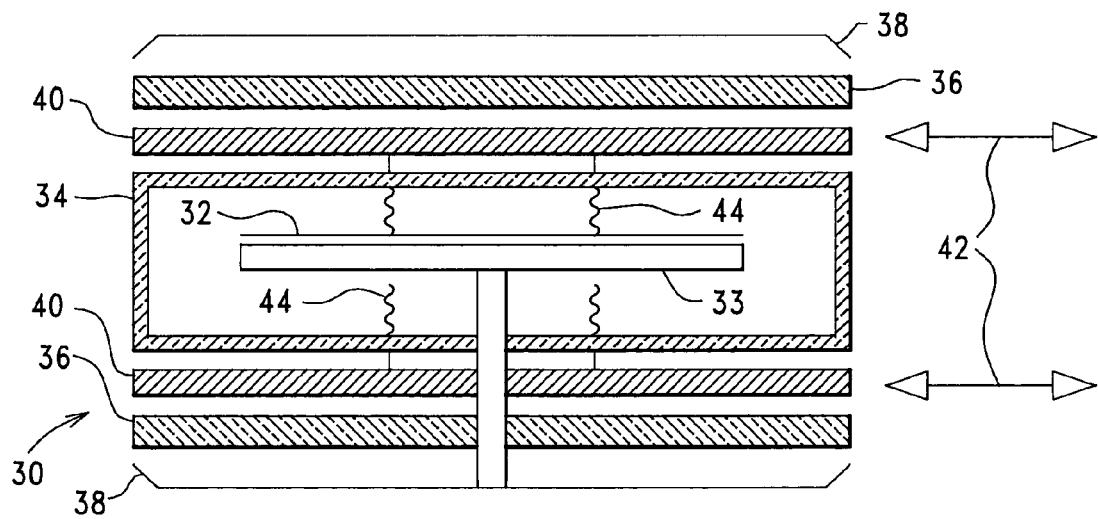
FIG. 2 is taken directly from FIG. 3 of U.S. Pat. No. 6,259,062, repeated here for purposes of discussing the post-process cooling shutter implementation of the '062 patent.

Having previously described FIGS. 1 and 2, attention is immediately directed to FIG. 3 which is a diagrammatic elevational view of an RTP treatment system, produced in accordance with the present invention, and generally indicated by the reference numeral 100. It is noted that like reference numbers are used to refer to like components throughout the various figures and that the figures are not drawn to scale in order to enhance the understanding of the reader. Moreover, it is to be understood that terminology such as, for example, "upper", "lower", "left", "right", "above", "below" and "side", is used for descriptive purposes only and is not intended as being limiting in any way with regard to operational orientations and any modifications relating thereto. Further, in the instance of a plurality of like components in a figure, a limited number of those like components, or only a single one, may be indicated using a reference number, in order to preserve the clarity of the drawings.

Still referring to FIG. 3, system 100 includes an array of cylindrically shaped, elongated heating lamps 102 (several of which are indicated individually, seen in an end view) such as, for example, tungsten halogen lamps, although any suitable type of lamp either currently available or yet to be developed, may be used. Lamps 102 cooperate to define a heating plane 104 which is indicated using a dashed line. It should be appreciated that the heating plane is a descriptive construct representing a plane source from which heat may be thought of as emanating, and as such a construct, the heating plane is not limited to the particular location shown, but may be moved into and away from the lamp array, in any appropriate manner. A workpiece 106 such as, for example, a semiconductor wafer is supported having an upper, major surface 108 in a confronting relationship with lamps 102. In this configuration, upper surface 108 of the workpiece is typically at least approximately parallel to heating plane 104. Workpiece 106 is generally supported either at its periphery or by a minimum of 3 support pins (not shown). A peripheral support may be fabricated from quartz ($SiO_2$) or silicon carbide or some other material having compatible thermal and chemical stability. Support pins are typically fabricated from either silicon carbide or quartz. The workpiece 106 is typically surrounded on all sides or around its perimeter if the workpiece is a wafer by a slip free ring 110 which is diagrammatically illustrated and is itself generally circular in configuration so as to surround contemplated workpieces, such as semiconductor wafers, having a circular periphery. As is known in the art, slip free ring 110 is useful in preventing adverse temperature effects about the outer periphery of the workpiece caused by more rapid temperature rate of change as compared to the remainder of the workpiece 106. Workpiece 106 is generally rotated at an appropriate rate during treatment to enhance uniformity of heating of the workpiece. The slip free ring is usually held stationary so that any thermal effects from asymmetry are reduced or eliminated by time averaging. It should be appreciated that lamps 102 cooperate to define heating plane 104 having an overall rectangular or square peripheral outline, while the periphery of the workpiece is generally circular. In this regard, it is considered that the peripheral outline of the heating plane may be formed in any suitable shape so long has the workpiece is subjected to a suitable radiation pattern across major surface 108 with rotation of the workpiece. As will be seen, the present invention remains equally applicable so long as the heat source includes segmented elements. For example, a heat source may readily be used which incorporates lamp tubes having different lengths so as to approximate a circular planar heat source.

A showerhead arrangement 120 may be interposed between lamps 102 and workpiece 106 including a first generally planar member 122, nearest lamps 102, and a second generally planar member 124 that is positioned between first generally planar member 122 and workpiece 106 as is shown in FIGS. 3 and 4. Accordingly, a showerhead chamber 126 is defined between the first and second generally planar members into which a process gas or gases (not shown) may be introduced using a passage 128 which may be formed at one or more locations located around the periphery of the showerhead chamber 126. Lower planar member 124 defines a plurality of through holes 130, several of which are individually indicated, such that the process gas injected using passage 128 travels through chamber 126 and is emitted from through holes 130 to impinge upon surface 108 of the workpiece. Suitable gases for use in this application comprise any appropriate gas including, but not limited to Ar, $N_2$, $O_2$, He, $N_2O$, NO, $H_2$, $NH_3$ and $H_2O$. Planar members 122 and 124 may be formed from any material which is suitably transparent to a radiation 132 that is emitted by lamps 102, such materials include, for example, plate quartz, which is readily machinable or aluminum oxide or aluminum oxynitride.

With continuing reference to FIG. 3, a shutter arrangement, produced in accordance with the present invention, is generally indicated by the reference number 200. Shutter arrangement 200 includes a reflector plate 202 which supports lamps 102 using clips (not shown) that are arranged at opposing ends of each of the elongated lamps. Reflector assembly 202 may be formed from any suitable heat resistant material including, for example, aluminum, titanium or stainless steel.

Figure 5:
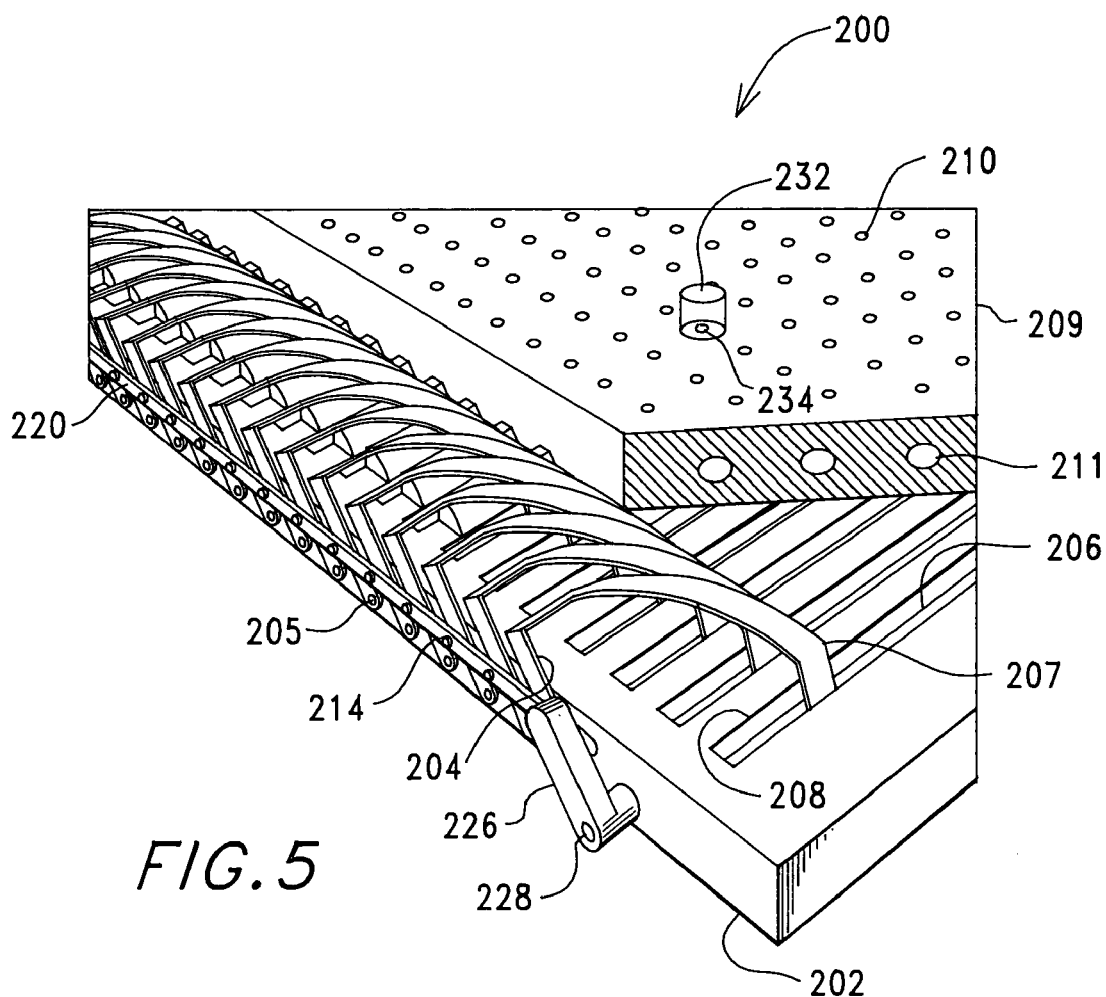
FIG. 5 is a diagrammatic view, in perspective, showing further details of the shutter arrangement of FIGS. 3 and 4.

Turning to FIG. 5 in conjunction with FIG. 3, the former figure is a partial cutaway, perspective view of shutter arrangement 200 looking down onto the top of the shutter arrangement in the view of the figure, so as to show the side of the arrangement which is away from lamps 102. A plurality of pivot arms 204 each includes one end pivotally attached to reflector plate 202 at a pivot position 205. An opposing end of each pivot arm 204 is fixedly attached to one of a plurality of elongated, arcuate-shaped shutter members 206 (only an upper edge of which is visible in FIG. 5) using a ribbon arm 207 which is described in further detail below. It should be appreciated that the opposing ends of the elongated shutter members may be pivotally situated in a manner which is essentially identical to that end which is illustrated, but these opposing ends have not been shown due to illustrative limitations. It is noted that the present figures show the shutter members in a retracted position and that an end view of shutter members 206 has been provided in FIG. 3 by virtue of cutting away reflector plate 202 so as to expose the shutters. Each elongated shutter is received for movement in one of a series of slots 208 formed by reflector body 202. Slots 208 are clearly seen for housing shutter members 206 (only a trailing edge of which is visible) in FIG. 5 as a result of cutting away one corner of a reflector back plate 209 that is supported on the upper surface of reflector plate 202. Reflector back plate 209 defines a plurality of through holes 210 through which gas is forced, aligned with slots 208, which are used to provide cooling gas to lamps 102 since certain forms of heating elements such as, for example, tungsten-halogen lamps, require operation in a specified temperature range. In order to provide enhanced cooling, the reflector plate may define a series of cooling channels 211 through which an appropriate cooling fluid such as, for example, water or other thermal exchange liquid may be caused to flow. Alternatively, a liquid coolant may be present in the channels without the need for an induced external how. That is, the liquid may flow passively as a result of induced heating to produce an advantageous heat redistribution/circulation within the reflector plate, for example, as a result of convection. Reflector back plate 209 is not shown in FIG. 3 for purposes of clarity. Moreover, there is no requirement for shutter members 206 to be completely received in reflector plate 202 in their retracted positions; the shutters may readily extend partially above or below reflector plate 202 with appropriate modifications.

Still referring to FIGS. 3 and 5, each shutter member 206 includes ribbon arm 207 that is arcuate in shape and is fixedly attached to the upper end of one of pivot arms 204. Advantageously, ribbon arms 207 may be integrally formed with the elongated shutter members at each opposing end. Each ribbon arm may be attached to a respective one of the pivot arms in any suitable manner depending, of course, on material types. Pivot arms 204 may be formed from suitable materials such as, for example, aluminum, stainless steel, plated beryllium or titanium. Shutter members 206 may be formed from suitable materials including, but not limited to titanium, stainless steel, plated beryllium and aluminum. The specific material that is used may be tailored to a particular application considering factors such as, for instance, expected temperatures, material thickness, thermal processing requirements including peak temperature, lamp power settings and processing time.

Each pivot arm 204 includes an outwardly extending pivot pin 214 which may be retained in each pivot arm in any suitable manner. Each pivot pin 214 is received in a through hole of an elongated actuator bar 220 and may be retained therein in any suitable manner such that all of shutters 206 are movable, in unison, by moving actuator bar 220. It should be appreciated that such movement can be accomplished in an essentially unlimited number of ways, including the use of a gearing arrangement that is driven by a suitable motor or a linear actuator. The present example illustrates a motor 222 (FIG. 3) having a drive shaft 223 which drives a disk 224 that is pivotally attached to actuator bar 220 using a pivot pin 214'. The motor drive shaft 223 is aligned with the pivotally hinged ends of pivot arms, while a distance between shaft 223 and pin 214' corresponds to the radial distance between pivot position 205 and pin 214 of each pivot arm, such that rotation of disk 224 by the motor provides appropriate movement of actuator bar 220.

It is considered that certain advantages are associated with the use of a stepper motor or an AC synchronous motor in driving the shutter arrangement of the present invention. As will be further described below, it is generally desired to open and close the shutters as rapidly as possible. That is, a stepper motor or an AC synchronous motor can be programmed with a selected "ramp-up" and "ramp-down" speed profile. Accordingly, for example, the motor can be electrically driven in a way which provides for maximum acceleration upon initiating shutter extension. Upon approaching the extended position of the shutters, the motor controller can then be employed to provide deceleration in a way which avoids "slamming" or overshooting the extended position—either of which can potentially result in damage. Such acceleration and deceleration is just as readily provided when moving from the extended position to the retracted position. Control in the retraction direction can be equally precise. In any implementation, it is to be understood that the present invention further contemplates the use of a stepper motor or an AC synchronous motor directly driving a gearing assembly which, in turn, drives the shutter arrangement.

Referring to FIG. 5, an alternative arrangement is illustrated for an opposing end of actuator bar 220 (i.e., opposite motor 222 of FIGS. 3 and 4) wherein a pivot lever 226 pivotally receives one of pivot pins 214. At the same time, an opposing end of pivot lever 226 is pivotally attached to reflector plate 202 at a pivot point 228, such that movement of actuator bar 220 causes the pivot lever to stabilize actuator bar 220. This arrangement forms one basis of an alternative drive arrangement to be described immediately hereinafter.

Figure 6:
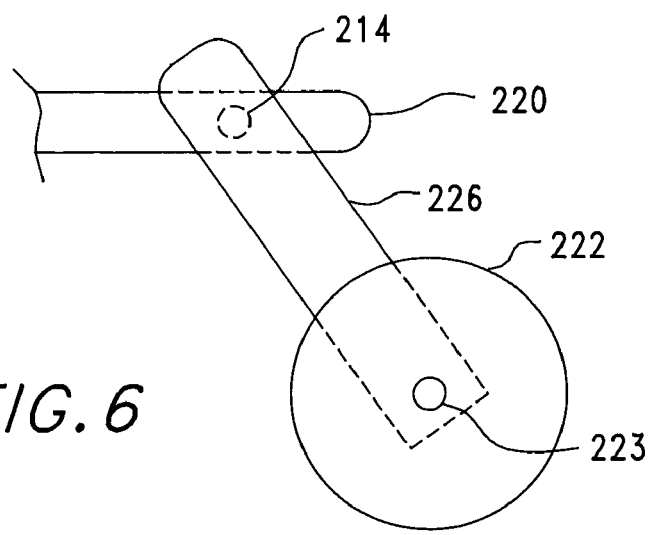
FIG. 6 is a diagrammatic side view of an arrangement for use in actuating the shutters of the present invention.

Referring to FIG. 6, a configuration for driving pivot lever 226 is diagrammatically illustrated. As described above, pivot lever 226 pivotally receives an appropriately positioned one of pins 214 for rotation. In this instance, however, drive shaft 223 of an additional motor 222 is attached so as to provide for selective rotation of pivot lever 226 about pivot point 228 which, in turn, moves actuator bar 220 to then move shutters 206. It should be appreciated that the described drive arrangements can be used in any suitable configuration or combination.

Referring to FIGS. 3, 5 and 6, it should be appreciated that an extended drive shaft (not shown) may be attached to motor 223 in order to drive similarly configured shutter actuator mechanisms which are arranged at the opposing side of the shutter arrangement. A similar arrangement will be described in detail below using a motor having a double-ended drive shaft. Moreover, pivot lever 226, shown in FIG. 5 may also be used at the opposing side of the shutter arrangement. If so desired, opposing pivot levers may be driven in any suitable manner such as, for example, using additional motors or drive arrangements to provide for still more synchronized or coordinated movement of shutters 206. It is to be understood that any suitable number of motors may be used within the scope of the present invention, even including four motors, wherein one of the motors is used to drive each opposing end of each one of a pair of actuator bars 220. As will be described below, coordinated, smooth movement of the shutters is related in a general sense to a number of operational considerations including, but not limited to provisions for "symmetrical," balanced, and coordinated drive of the opposing ends of the shutters.

Referring solely to FIG. 5, instrumentation may be provided in any suitable manner for purposes of monitoring process parameters. As an example, reflector plate 209 supports a instrumentation device 232 which is situated to view workpiece 106 through the shutter arrangement using an aligned through opening 234 (only the entrance of which is shown). Suitable instrumentation devices include, but are not limited to optical pyrometers, emissomiters and reflectometers. It is noted that instrumentation device 232 is also useful for establishing the temperature of shutters 206, particularly when the shutters are subjected to the lamp radiation for any period of time. Any suitable number of instrumentation devices may be employed.

Still another aspect of monitoring process parameters resides in an awareness of the position of the shutter blades. In this regard, it should be appreciated that stepper and AC synchronous motors are readily driven using a digital motor drive controller. Accordingly, the motor controller can monitor the rotational position of the motor shaft that has been commanded to move so as to track the position of the shutters in an closed-loop fashion. An end position switch, or a "home" position switch, that is often employed to establish a reference position, may be used to indicate to the motor controller a particular position of the shutter blades, for example, the retracted position of the shutter blades. As a further enhancement or alternative, an encoder such as an optical encoder may be attached to the motor shaft for directly indicating the position of the motor shaft in a manner which is well known to those having ordinary skill in the art.

Having described shutter assembly 200 of the present invention in detail, attention is now directed to details of its operation and its attendant advantages. To that end, the reader is initially referred to FIGS. 3 and 5, each of which illustrates shutter arrangement 201 of the present invention with shutters 206 in their open or retracted positions. With initiation of shutter closure, shutters 206 move out of reflector plate 202 in the direction of lamps 102.

Figure 7:
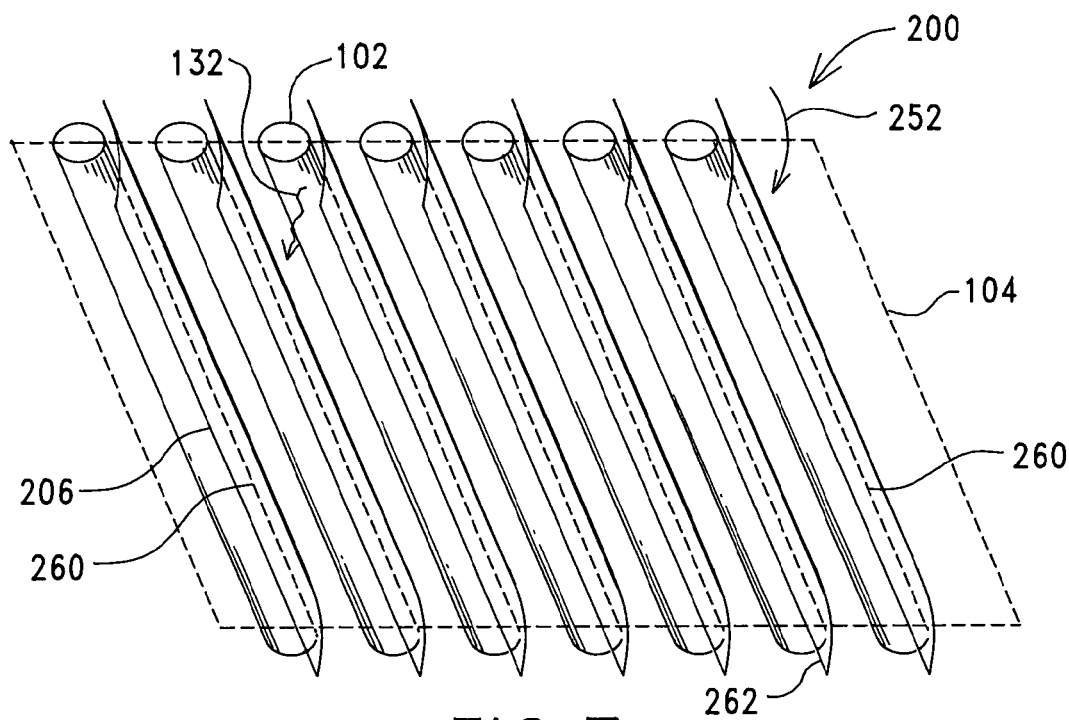
FIG. 7 is a diagrammatic view, in perspective, of the shutter arrangement of the present invention, taken from the side of the shutter arrangement which confronts a workpiece, shown here to illustrate movement of the shutters relative to a heating arrangement.

Referring to FIG. 7, in conjunction with FIGS. 3, 5 and 6, as the movement of the shutters progresses, each individual shutter moves proximate to or between an adjacent pair of lamps 102 (FIG. 7) to then pass through heating plane 104. In FIG. 7, shutter arrangement 200 is shown using a diagrammatic bottom view, in perspective, which illustrates shutters 206 moved to intermediate positions, between their retracted and extended positions, after having rotated in a direction indicated by an arrow 252. Heating plane 104 is illustrated using dashed lines to show where each shutter intersects the heating plane, in this intermediate position, along a dashed line 260. In this regard, it is to be understood that no requirement is imposed herein for withdrawing shutters 206 to "open" positions which are completely above lamps 102 or heating plane 104, in the view of FIG. 7. That is, the shutters may extend at least partially between adjacent lamps 102 or partially forward of heating plane 104, in their retracted positions, so long as radiation 132 is directly incident on workpiece 106. Retraction of shutters 206 completely into reflector plate 202 may be advantageous in protecting the shutters from prolonged exposure to direct lamp radiation.

Figure 8:
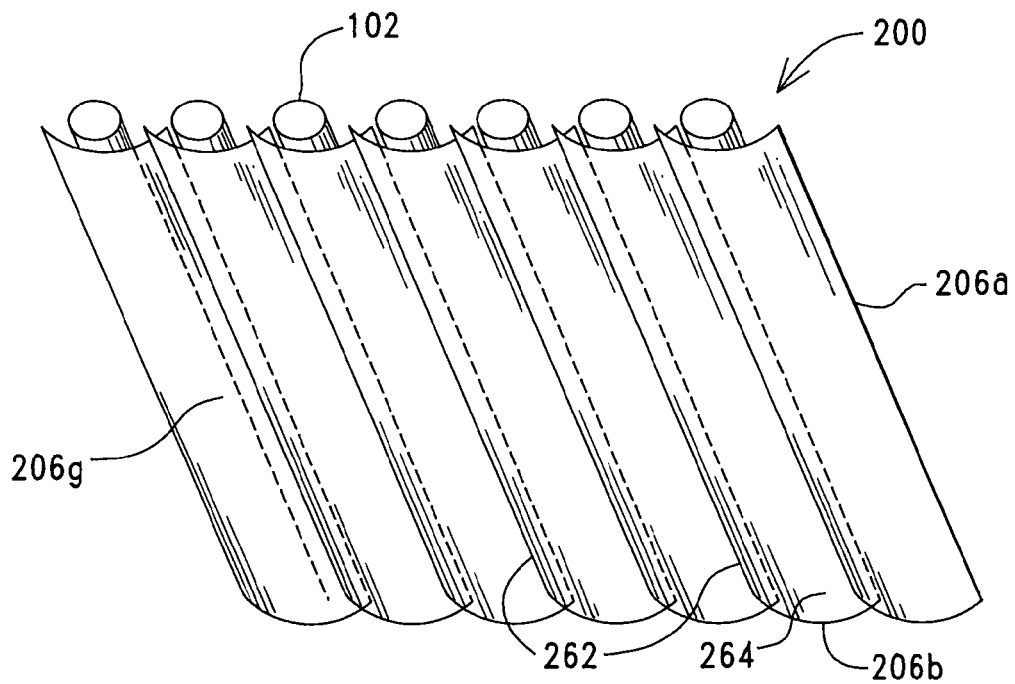
FIG. 8 is a diagrammatic view, in perspective, of the shutter arrangement of FIG. 7, taken from the side of the shutter arrangement which confronts a workpiece, shown here to illustrate the shutters in their extended positions.
Figure 9:
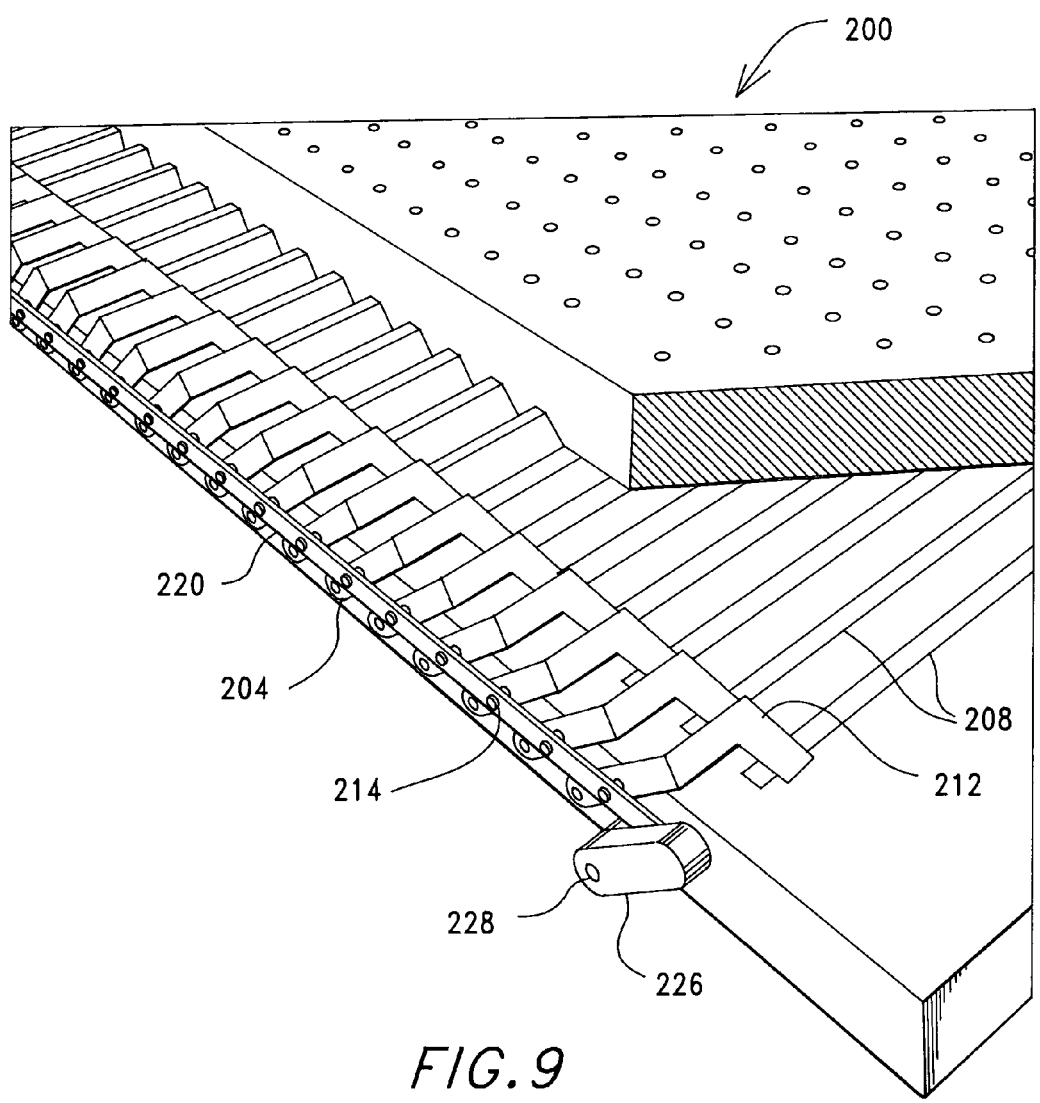
FIG. 9 is a diagrammatic view, in perspective, of the shutter arrangement of FIGS. 3–8, looking at the back side of the shutter arrangement, away from the workpiece, showing the shutter actuation mechanism in its extended position, as well as illustrating details of the reflector assembly which supports the shutter arrangement.

While FIGS. 4, 8 and 9, illustrate shutters 206 in their extended positions, FIG. 8, in particular, is useful in diagrammatically showing details of the extended positions for shutters indicated as 206a–g. Specifically, a leading edge 262 of a first shutter 206a is proximate to an outer surface 264 of a second shutter 206b. Of course, shutter 206g comprises the last shutter in the series and, as such, has no shutter ahead of it to contact in the extended position.

It is noted that an end shutter 206a shown in FIG. 4 at the right side of the shutter arrangement, does not block light 240 which is emitted by a rightmost one of lamps 102 since light 240 is not incident on workpiece 106, but rather on slip free ring 110. In this regard, it is important to remember the shape of the shutter blade as shown, for example, in FIGS. 3–5. That is, while ribbon arms 207 are visible in the end view of FIG. 4, they do not serve to block light, only the elongated shutter at the lowermost end of the ribbon arm serves in this capacity. Similarly, light 250 that is emitted from the leftmost lamp 102 is not incident upon workpiece 106, but falls on slip free ring 110. Light 250, nonetheless, is blocked by the shutter arrangement as seen in FIG. 4, since this light falls directly on an elongated shutter blade.

Referring to FIGS. 3 and 4, it should be appreciated that slots 208 (only one of which is designated by a reference number), as is visible for a rightmost slot in FIG. 3, are configured in a way which assists in guiding each shutter along a path between the retracted and extended positions. At the least, slot 208 is configured to match the trajectory of the shutter blade in moving between the retracted and extended positions, since each shutter has a rigid shape. Thus, the slot is designed to receive the shutter blade when it is in its retracted position so that the shutter blade does not impair the light emitted from the lamps and may be thought of as a storage cavity for the shutter. In this embodiment, there is, at least approximately, a one-to-one correspondence between the number of lamps 102 and the number of shutters 206. It is of interest to note that each shutter rotates approximately one-half way around one of lamps 102 in transiting from the retracted position to the extended position. As seen in FIG. 4, each shutter moves past the lamp about which it rotates so as to be at least partially positioned below next adjacent lamp 102.

Referring to FIGS. 3–5 and 9, ribbon arms 207, pivot arms 204 and slots 208 are configured to cooperatively avoid interference between adjacent shutters 206 and ribbon arms 207 in moving between the retracted and extended positions. It is considered that one of ordinary skill in the art may readily implement a wide variety of appropriate ribbon arm configurations in view of this overall disclosure with an objective of preventing the shutter arms from contacting one another during any portion of the shutter blade rotation.

Having described shutter arrangement 200 of the present invention in detail above, it is worthwhile to discuss several of its advantages. One advantage resides in the fact that shadowing on a workpiece is completely avoided, while still using a segmented shutter arrangement. This is considered to provide sweeping advantages over prior art shutter arrangements that are supported between the heat source and the treatment source such as exemplified by the Pas reference, which is described above. Until now, it is submitted that there was no solution to the shadowing problem when a segmented shutter was used.

As a further advantage, the absence of shadowing is accompanied by the ability to at least partially block radiation from reaching a workpiece in a highly symmetrical, rapid manner. That is, a unitary slide-in shutter such as seen in the Pan reference, described above, is considered as unacceptable in the context of the present invention, since slidingly moving the shutter into a blocking or extended position, inherently progressively blocks radiation. In the implementation of Pan, for example, it is estimated that the shutter would necessarily move at least 14 inches between its retracted and extended positions for a 300 mm diameter wafer. If this action is performed while a significant level of radiation is incident on the workpiece, the result is a highly asymmetric or unbalanced heat treatment. This movement has the additional effect of causing asymmetric cooling of the substrate. These effects are additive in nature and result in a larger thermal treatment asymmetry. One may attempt to cure this difficulty by moving the shutter more rapidly, however, it is submitted that extremely high and impractical rates of movement are necessitated. In this regard, it is noted that mere rotation of the workpiece is considered to be insufficient to cure this asymmetric result, since the shutter is generally extended in less than one rotation. Even if the workpiece rotation speed could be substantially increased, it is submitted that the Pan shutter would still induce a radial asymmetry. The present invention, in contrast, utilizes a segmented shutter arrangement wherein each shutter moves a relatively short distance while completely eliminating shadowing. For the embodiment introduced by FIGS. 3 and 4, it is estimated that each shutter member moves in an arc having a length of no more than 4 inches (far less than the wafer diameter) between the retracted and extended position of each shutter. Remarkably, movement is reduced by a factor of more than three. In and by itself, this difference is considered to provide sweeping advantages over the prior art, in view of the attendant elimination of shadowing.

It is recognized that the Pan shutters arrangement could be improved, at least to a limited extent, for example, by using shutters which slide in from opposing sides or using an iris-like shutter arrangement such as is seen in cameras. This improvement may remain insufficient in coping with larger workpieces in conjunction with more demanding process requirements.

It is also important to understand that any shutter arrangement, such as is taught by Pas, having its shutters positioned between the heating arrangement and wafer at all times, is subject to significant heat related problems. For example, longer term exposure of the shutters directly to the heating arrangement will ultimately lead to high shutter temperatures, irrespective of shutter orientation with respect to the heating arrangement as well as selected emissivity surfaces and coatings. In certain circumstances, such coatings may themselves become problematic in a prior art implementation. For instance, it is generally desirable to have a high emissivity coating facing the wafer with the shutters in an extended position. If these shutters are then pivoted to a retracted position, the high emissivity Heating is at least partially exposed to direct radiation from the heating arrangement. Accordingly, it is submitted that such prior art shutter arrangements require extreme care with respect to selection of the coefficient of thermal expansion for components, thereby severely limiting specific materials which may be used. One may consider using an active cooling arrangement in an attempt to cope with this problem such as, for example, by forming a liquid receiving cooling channel through each shutter. Unfortunately, however, still further complications are introduced due to significant increases in the bulk and momentum of the shutters, thereby reducing responsiveness to movement. The present invention is thought to completely resolve these problems since the retracted shutters may be housed entirely in the reflector assembly.

With reference to FIG. 5, the temperature of shutter blades 206 is regulated by thermal radiation to the shutter cavity when the blades are retracted and by cooling gas flowing from reflector plate 209 to slots 208, thereby removing heat from retracted blades contained in cavities 208. In fact, the leading edge of each shutter may be retracted slightly into the reflector assembly such that it is shadowed from direct exposure or, as described below, this leading edge may be configured for reflecting the radiation. In one embodiment, the shutter blades may be preheated in order to reach a predetermined thermal equilibrium state prior to processing a first workpiece.

Shutter arrangement 200 has the highly advantageous ability, as is shared by all embodiments of the present invention, to modify the time-temperature profile experienced by the workpiece. By adjusting the speed as well as the start time of the shutter blade extension in relationship to the time that the lamps are turned off (or some other appropriate triggering event), the shape at the peak of the thermal profile can be varied such that the rate of rise is maximized, the time at the maximum temperature is minimized and the rate of cooling from the maximum temperature is maximized, resulting in a sharp peak or spike rather than a more rounded profile. Of course, with this objective in mind, shutter operation may be controlled, for example, responsive to pyrometer readings such as the workpiece reaching a predetermined temperature. Maximizing the sharpness of the thermal profile has the benefit of producing increasingly shallow and abruptly defined junctions. Thus, the shutter arrangement of the present invention achieves greater control of the time-temperature profile than previously obtainable. In this regard, it is desired to move the shutter blades from their retracted position to their extended position as fast as possible. The present invention contemplates a shutter extension time period ranging from approximately 10 ms to 300 ms. It is considered that a 50–150 ms shutter extension period will provide process benefits.

Figure 10:
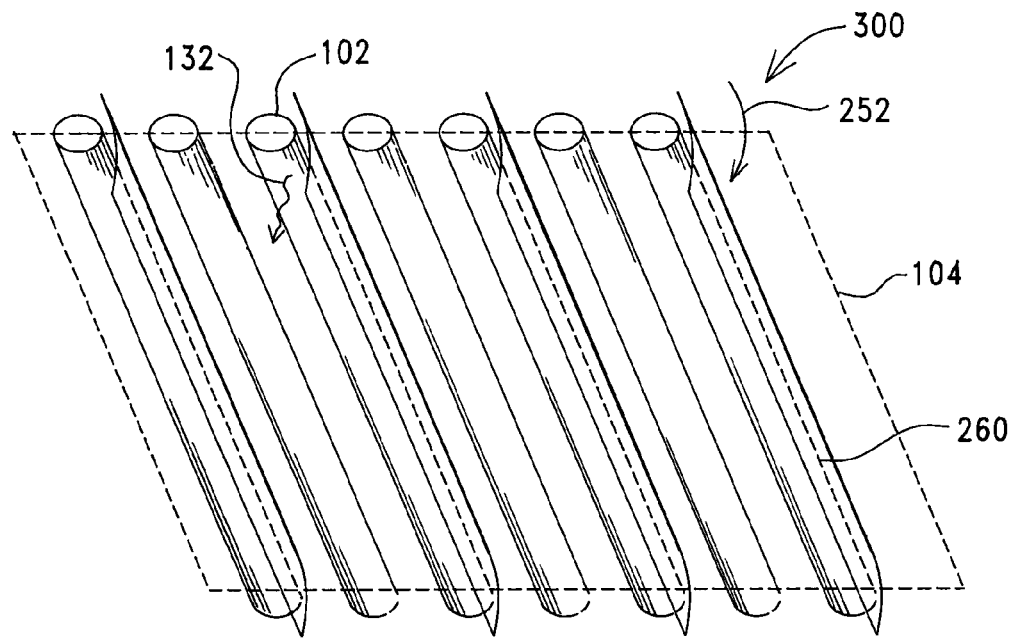
FIG. 10 is a diagrammatic view, in perspective, of another implementation of the present invention, looking at the side of the shutter arrangement which faces the workpiece, in which the shutters are shown moving through a heating plane and wherein each shutter moves between alternate adjacent ones of the heating lamps.
Figure 11:
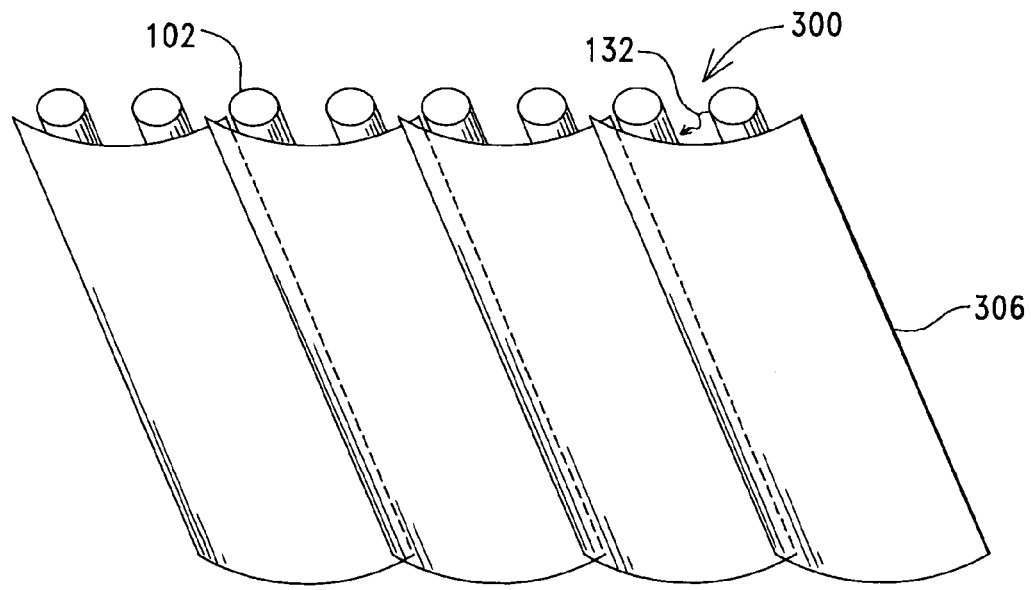
FIG. 11 is a diagrammatic view, in perspective, of the shutter embodiment shown in FIG. 10, again looking at the side of the shutter arrangement which faces the workpiece, in which the shutters are shown in their extended positions such that one shutter is in a confronting relationship with two heating lamps.

Turning to FIGS. 10 and 11, another embodiment of the shutter arrangement of the present invention is generally indicated by the reference number 300. Shutter arrangement 300 shares the advantages of previously described shutter arrangement 200 while providing still further advantages. Accordingly, the present discussion will be limited, for the most part, to those aspects in which shutter assembly 300 is different from shutter assembly 200. It is considered that one of ordinary skill in the art may readily implement shutter arrangement 300 by using the present description in conjunction with the foregoing description of shutter arrangement 200. A primary difference is found, however, in that shutter arrangement 300 uses a plurality of shutters 306, each of which is, at least approximately, twice as wide as shutter 206 of shutter assembly 200. In this way, one of shutters 306 moves between every other one of lamps 102, as diagrammatically seen in FIG. 10. FIG. 11 illustrates shutters 306 in their extended positions such that each shutter is at least generally beneath two of lamps 102 so as to block radiation 132.

Figure 13:
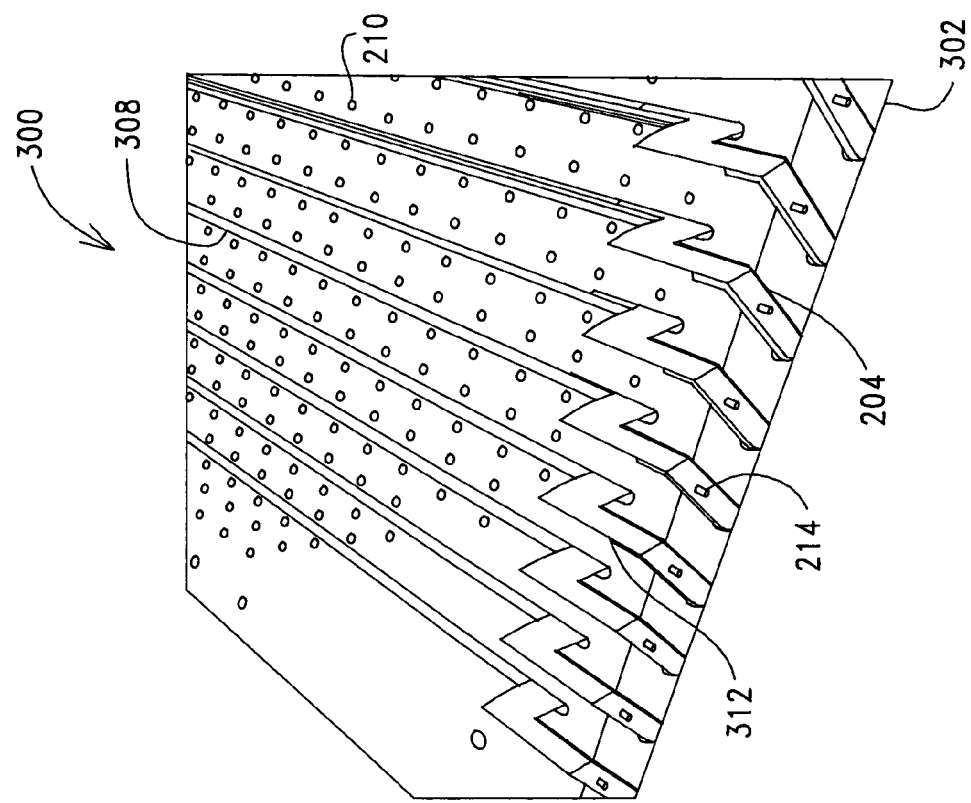
FIG. 13 is a diagrammatic view, in perspective, of the shutter arrangement of FIG. 12, again looking at the back side of the shutter arrangement, away from the workpiece, showing the shutter actuation mechanism in its extended position.
Figure 12:
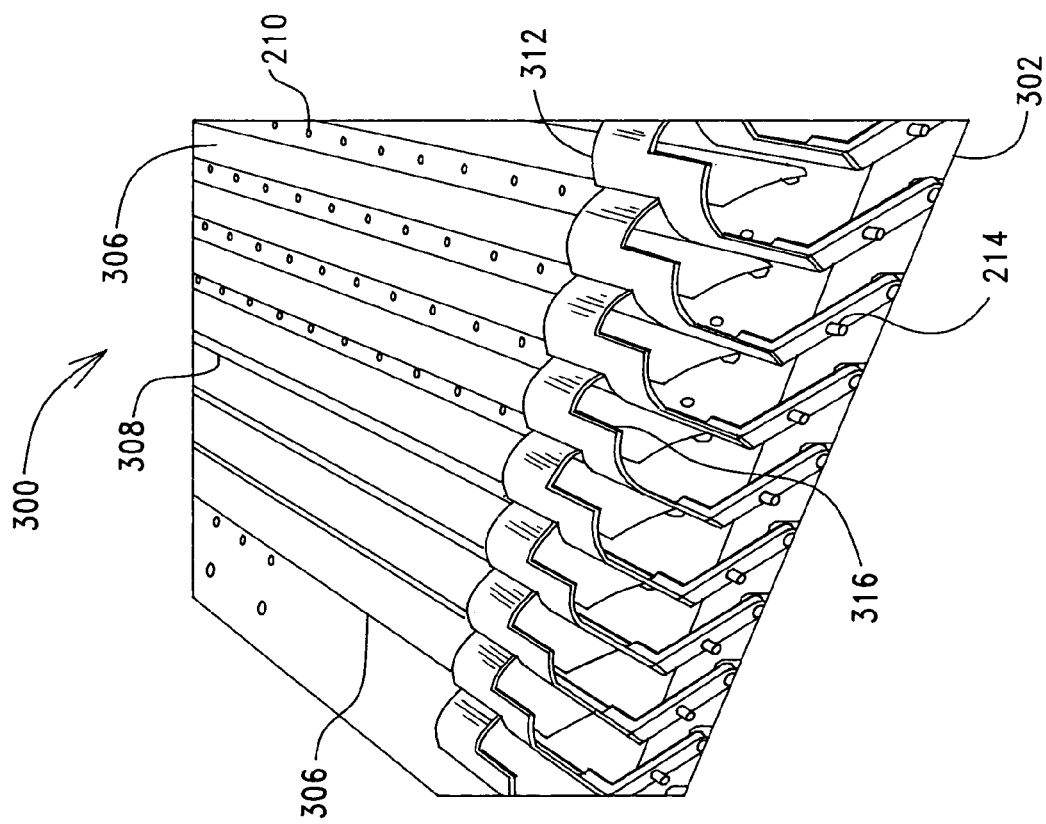
FIG. 12 is a diagrammatic view, in perspective, of the shutter arrangement of FIGS. 10 and 11, looking at the back side of the shutter arrangement, away from the workpiece, showing the shutter actuation mechanism in its retracted or open position, as well as illustrating details of the reflector assembly which supports the shutter arrangement.

Referring to FIGS. 12 and 13, shutter arrangement 300 is shown from above, in a diagrammatic perspective view, having a reflector assembly 302 which includes half as many slots 308, as compared to slots 208 of arrangement 200 (FIG. 5), such that one shutter 306 is received for movement in each slot 308. FIG. 12 illustrates shutter arrangement 300 in the retracted, open position while FIG. 13 illustrates shutter arrangement 300 in the extended position. Each shutter member 306 includes a ribbon arm 312 that, like ribbon arm 207 of arrangement 200, is arcuate in shape, when seen from the side, and is fixedly attached to the upper end of one of pivot arms 204. Again, ribbon arms 312 may be integrally formed at each end of each elongated shutter member. Each ribbon arm may be attached to a respective one of the pivot arms in any suitable manner. As seen in FIG. 12, however, ribbon arms 312 are formed using a right angle offset section 316, as opposed to a continuous arch configuration seen in ribbon arm 207 of embodiment 200 (see FIG. 5, for comparison). Shutter arrangement 300 is also advantageous with respect to provisions for instrumentation such as instrumentation device 232 of FIG. 5, since there is roughly twice as much space between slots 308 of arrangement 300 as that between slots 208 of arrangement 200.

It is noted that the arrangement of shutters, in the extended position, may align in any suitable manner with respect to the array of heat lamps. In this regard, it is to be understood that the shutter arrangement of the present invention, in any suitable embodiment, is considered to be useful with any form of "arrayed" heat source or heat source that is made up of an arrangement of spaced apart elements, since the shutters of the present invention may readily be configured to move through any such array between the retracted and extended shutter positions. Moreover, depending upon scaling considerations, shutters may be widened relative to the heating element spacing to confront three or more heating elements.

Figure 14:
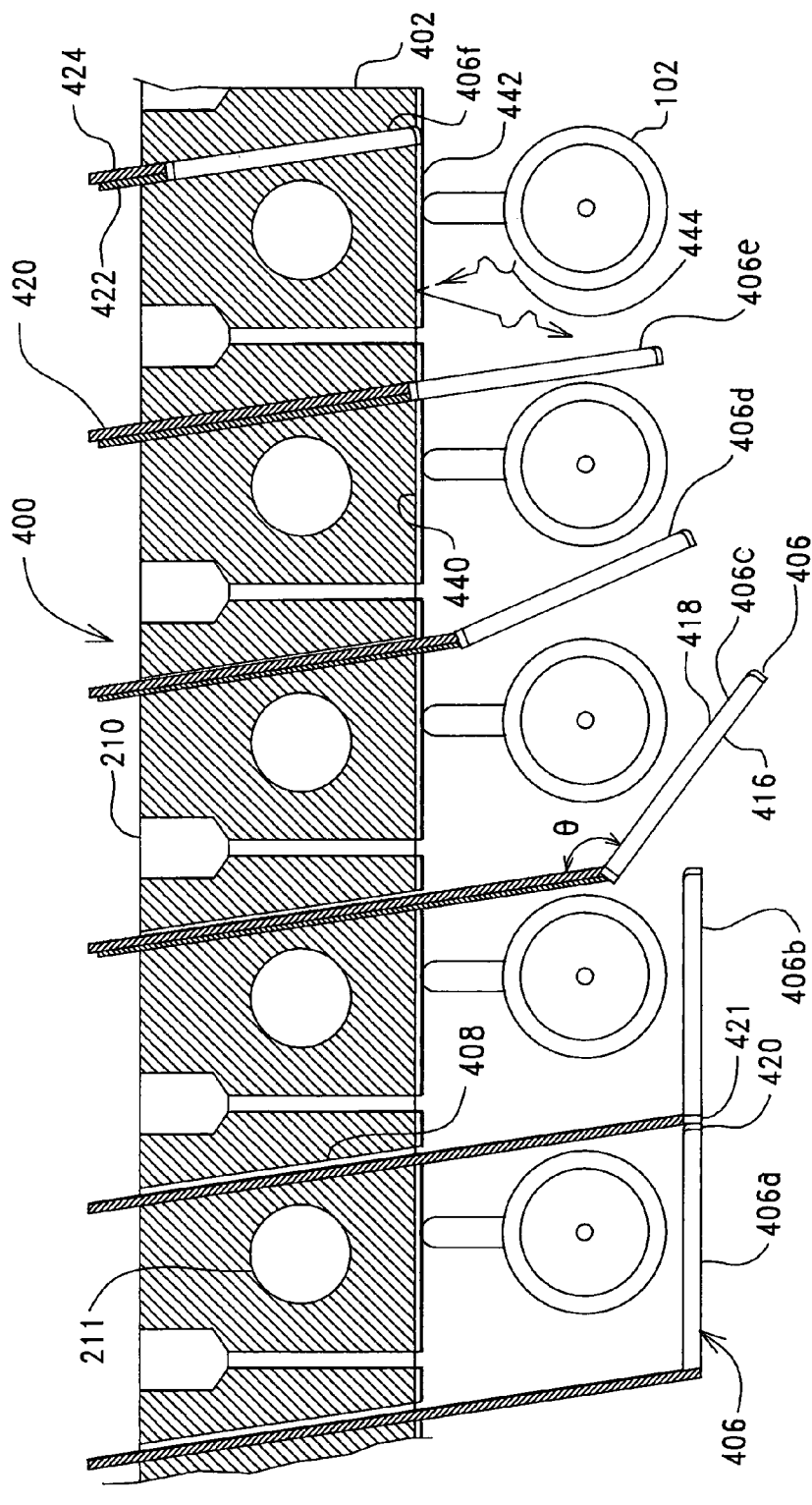
FIG. 14 is a diagrammatic view, in elevation, of another embodiment of the shutter arrangement of the present invention, shown here to illustrate details of its highly advantageous structure having planar shutter members shown in a progression of positions ranging from extended (closed) to retracted (open).

Referring to FIG. 14, still another embodiment of the shutter arrangement of the present invention is generally indicated by the reference number 400 which shares advantages of previously described embodiments. FIG. 14 is a partial cross-sectional view, in elevation, showing a reflector assembly 402 cut-away to reveal elongated shutters 406 in relation to a series of elongated slots 408 that are defined within reflector assembly 402. Suitable materials for use in forming shutters 408 include, but are not limited to titanium, stainless steel, plated beryllium and aluminum. Shutters 406a and 406b are shown in their extended positions, while shutters 406c–e are shown in intermediate positions. Shutter 406f is shown in a fully retracted position. It is to be understood that shutters 406 are illustrated in the manner of FIG. 14 to expeditiously show the various operational shutter positions, but that the shutters are readily configured for movement in unison, as will be further described.

Figure 15:
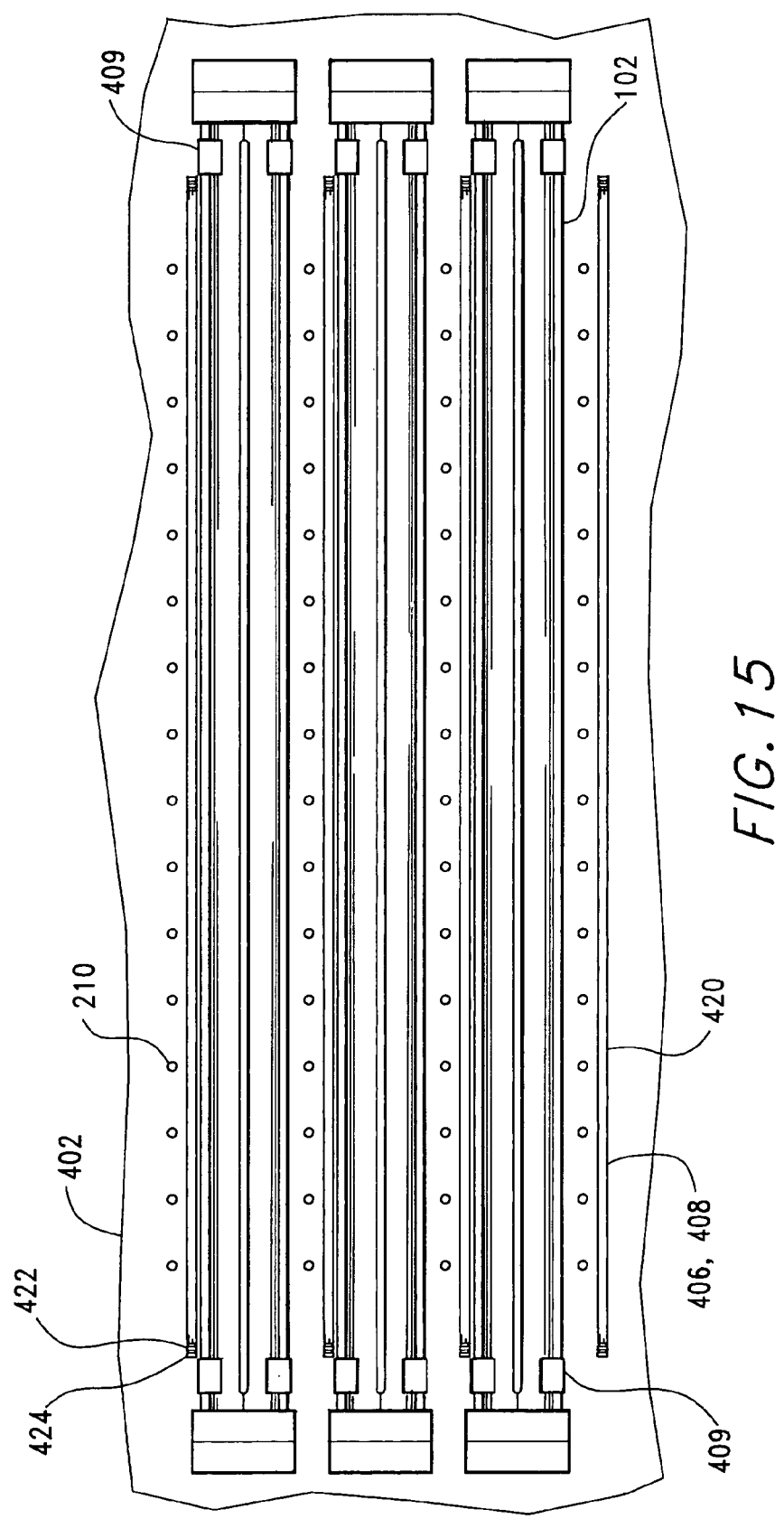
FIG. 15 is a diagrammatic bottom view of the shutter arrangement of FIG. 14, shown here to further illustrate details of its structure.

Turning to FIG. 15 in conjunction with FIG. 14, the former figure is a bottom view of shutter arrangement 400 with all of shutters 406 shown in their retracted positions within reflector assembly slots 408. It is noted that each lamp 102 is supported by a clip arrangement 409 at both of its opposing ends, as is the case with embodiments described above. Each shutter 406 is generally planar, having a thickness, seen in FIG. 14, defined between a pair of opposing major surfaces 416 and 418. When the shutters are in their extended positions, a leading edge 420 of shutter 406a is adjacent to, preferably not contacting, a trailing edge 421 of adjacent shutter 406b. In the illustrated embodiment, slots 408 include a uniform width that is slightly wider than the thickness of each shutter 406. Accordingly, pivotal movement of each shutter is performed with the shutter displaced entirely out of its respective slot 408. It should be appreciated, however, that this is not a requirement; slots 408 may include a configuration (not shown) which provides for at least partial rotation of the shutter partially received in its slot. The way in which shutter rotation is accomplished will be described immediately hereinafter.

Figure 16:
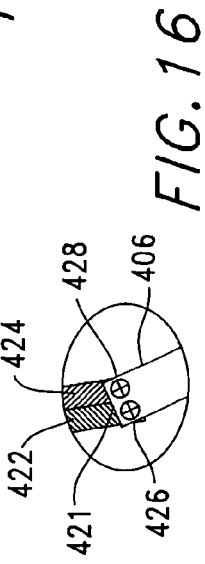
FIG. 16 is an enlarged elevational view diagrammatically illustrating the connection of a pair of control rods to a shutter in the embodiment of FIGS. 15 and 16.

Referring to FIGS. 14–16, each shutter 406 is moved using a pair of control rods 420 that is disposed at each opposing end of each shutter. Each pair of control rods includes a first control rod 422 and a second control rod 424. FIG. 16 is an enlarged view showing attachment of one pair of control rods to one shutter. The shutter ends of the first and second control rods are pivotally attached to positions 426 and 428, spaced apart along the width or thickness of each shutter 406, proximate to its trailing edge 421. Accordingly, moving a pair of control rods in unison produces a translational movement of the supported shutter with a fixed angle, θ, defined between the control rods and the shutter. Movement of control rods 422 and 424 relative to one another causes the supported shutter to rotate. In other words, angle θ changes responsive to the relative movement. Coordinated movements of the control rods then produce controlled movement between the retracted positions and the extended positions of the shutters. In this regard, it should be appreciated that the shutters may be moved in an unlimited number of different ways using different coordinated movements of the control rods.

In the example provided by FIG. 14, pivoting of the control rods ensues immediately upon each shutter clearing reflector assembly 402. As an alternative example (not shown), the shutter may be moved in two basic steps. First, the control rods may be moved in unison to translate the shutter from its retracted position to a rotate position. At the rotate position, the control rods are then moved relative to one another to rotate the shutter to its extended position. A specific mechanism for moving the control rods in coordination has not been shown, since it is considered that one of ordinary skill in the art may provide any number of suitable structures for accomplishing this task in view of this overall disclosure. It should be appreciated, however, that control rods 422 and 424 must be configured such that relative movement used to accomplish rotation of a supported one of shutters 406 does not produce interference at the ends of the control rods proximate to pivot positions 426 and 428. For example, it can be seen in the side view of FIG. 14 that the control rods of shutter 406e appear to be side-by-side, having the shutter extending collinear from its control rods. For shutters 406a and 406b, in their extended positions, however, control rod 424 appears to have moved to a position that is in front of control rod 422, such that the latter is barely visible, if at all. In one implementation, the control rods may be connected using hinging pins of different lengths in order to space the control rod ends at different distances from the edge of the shutter to which they are pivotally attached while, at the same time, the shutters may be formed from a resilient material in a way which permits them to bend slightly as the shutter is rotated from the unrotated, collinear position to the extended position. Suitable materials for use in forming the control rods include, but are not limited to stainless steel and titanium.

Appropriate coloration/coating schemes may be provided for any of the shutter arrangements of the present invention, as will now be described using shutter arrangement 400 of FIG. 14 as a nonlimiting example. As an example, surfaces 418 of the shutters which face lamps 102, with the shutters in their extended positions, may be reflective. In one implementation, a reflective coating such as, for example, gold, silver, polished or diffuse aluminum, white paint, or alumina may be applied to these surfaces. Surfaces 416, which face the workpiece (see FIG. 4), in their extended positions, may have a high emissivity by being highly absorbing to electromagnetic radiation from approximately 1 to 10 microns wavelength. For example, the surfaces can be coated with a black paint or with a white paint having selective reflector properties to allow the blade to not be heated by lamp radiation during deployment, but to still absorb radiation emitted by the workpiece. Leading edge 420 of each shutter 406, which confronts the lamps with the shutter in the retracted position, may be white or reflective in order to ameliorate heating of the shutter. Moreover, a surface 440 of reflector assembly 402, or any such reflector assembly surface that is present in any described embodiment, may be provided with a reflective coating 442 in order to redirect radiation 444 toward the workpiece, thereby improving heating uniformity while limiting heat absorption by the reflector assembly. Further, selective reflectivity may be employed either on the reflector assembly or other described surfaces, in a highly advantageous way as is taught in U.S. patent application Ser. No. 10/629,400 entitled SELECTIVE REFLECTIVITY PROCESS CHAMBER WITH CUSTOMIZED WAVELENGTH RESPONSE, filed on Jul. 28, 2003, which is commonly owned with the present application and incorporated herein by reference in its entirety.

Figure 17:
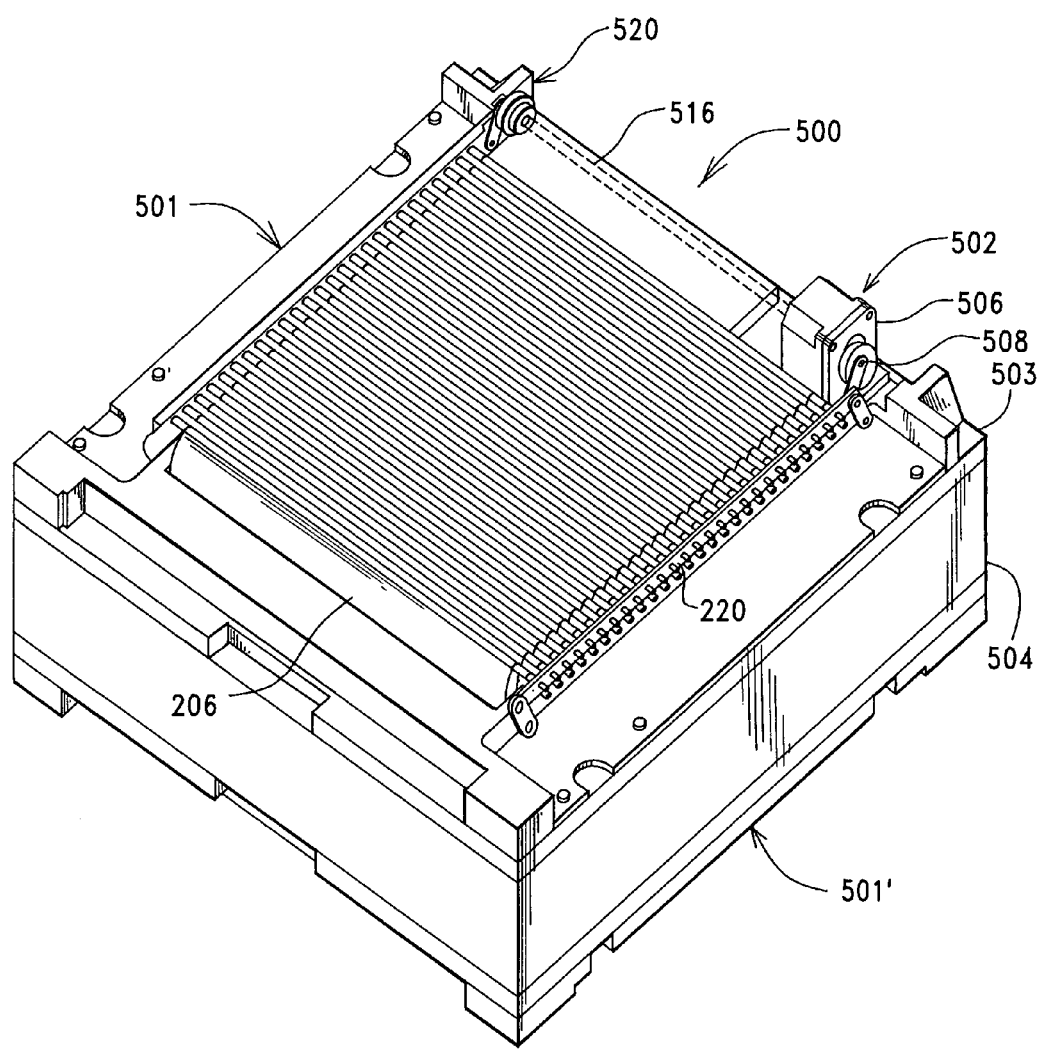
FIG. 17 is a diagrammatic view, in perspective, of still another embodiment of the shutter arrangement of the present invention, shown here to illustrate details of its highly advantageous construction.

Attention is now directed to FIG. 17 which illustrates a system, generally indicated by the reference number 500. System 500 includes another embodiment of the shutter arrangement of the present invention indicated by the reference number 501. Shutter arrangement 501 resembles previously described shutter arrangement 200, but having a modified stepper motor drive arrangement 502 supported by a reflector assembly 503, shown in a perspective view. The reflector assembly is, in turn supported by a chamber 504. It is also noted that another shutter arrangement 501', which can be, but is not necessarily identical to shutter arrangement 501, is arranged on the opposite side of chamber 504.

Figure 18:
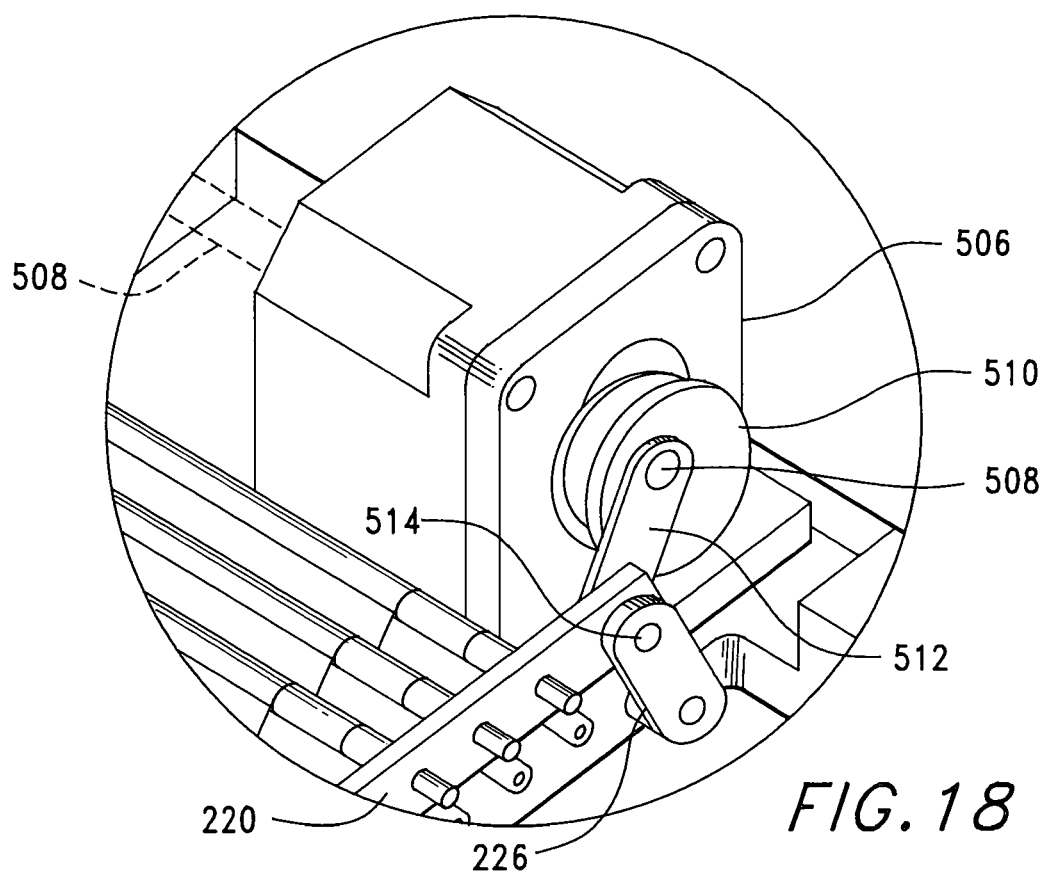
FIG. 18 is a partial, more enlarged diagrammatic view of one portion of the actuation mechanism of the shutter arrangement of FIG. 17, shown here to illustrate further details of its structure.

Referring to FIG. 18 in conjunction with FIG. 17, the former figure provides a more detailed view of a stepper motor 506 which is mounted on the reflector assembly and includes a double-ended drive shaft 508. One end of drive shaft 508 rotates a cam 510. One end of a linkage member 512 is pivotally attached to cam 510 while an opposing end of linkage member 512 is pivotally attached to an end of actuator bar 220. The linkage member and pivot lever 226 may be pivotally connected in any suitable manner to a common point 514 on actuator bar 220. Accordingly, rotation of cam 510 moves linkage member 512 which, in turn, causes actuator bar 220 to move shutters 206 between their retracted and extended positions.

Figure 19:
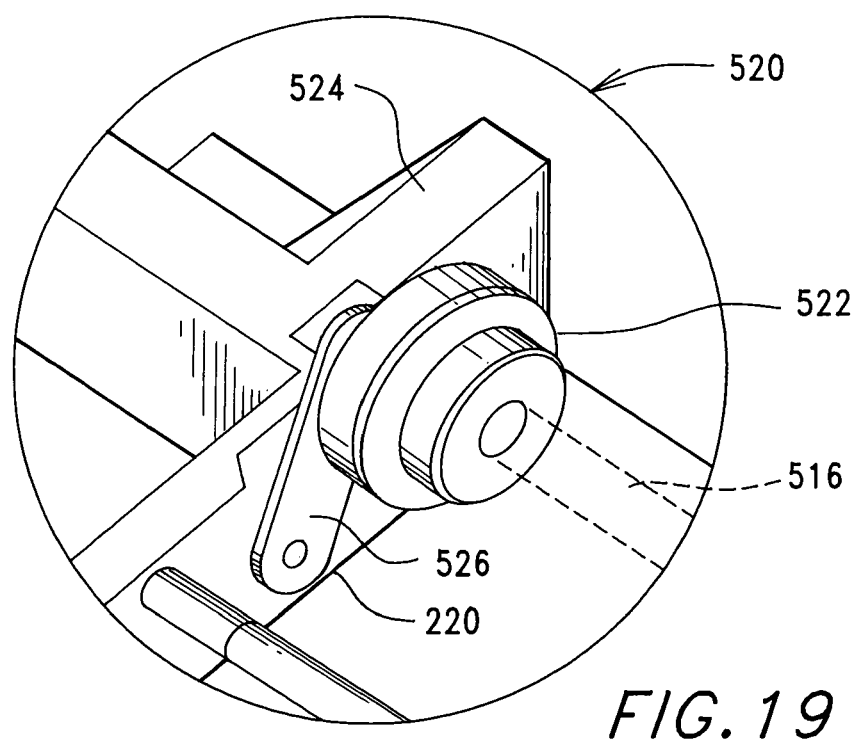
FIG. 19 is another partial, more enlarged diagrammatic view of a different portion of the actuation mechanism used in the shutter arrangement of FIG. 17, shown here to illustrate further details of its structure.

Referring to FIGS. 17 and 19, an opposing drive output of stepper motor 506 is connected to an extended drive shaft 516 (shown using dashed lines) which extend to an actuation arrangement 520 at an opposing side of shutter arrangement 500. Actuation arrangement 520, best sent in FIG. 19, includes a second cam 522 which is supported for rotation by a flange 524. Second cam 522 receives extended drive shaft 516 for rotation thereby. A second linkage member 526 is pivotally attached to second cam 522, while having an opposing end that is pivotally attached to an opposing actuator bar 220. By using this configuration, end-to-end actuation movements of each shutter 206 is balanced. That is, each shutter is subject, at least to an approximation, to the same actuation forces at either end. This configuration, as well as any similar configuration described herein, is considered to be particularly advantageous for reasons to be described immediately hereinafter.

One significant aspect of the operation of the shutter arrangement of the present invention resides in actuation speed. Specifically, how quickly the shutters can be moved, in either direction, between the retracted and extended positions. Even though the shutter arrangement of the present invention is highly advantageous in moving individual shutter blades a short distance without shadowing, the shutter blades should be moved at least fast enough to achieve acceptable uniformity in view of a particular process. A configuration, such as shown in FIGS. 17–19 and described at a number of other points in this specification, is particularly advantageous with respect to actuation time. It should be appreciated that any embodiment in which only one end of the shutters are driven will impart an increasing amount of twist to the shutter blades as actuation speed is increased. One solution is to stiffen the blades, however, such a solution inherently increases the momentum of the blades so as to compete with any attendant increase in speed. By driving both ends of the shutters, however, this concern over shutter blade twist is resolved for practical purposes. Viewed in a slightly different way, a significantly lighter weight shutter blade may be used in a dual-ended drive configuration, as compared to a single-ended drive configuration, attended by a decrease in actuation time. Moreover, lighter components may be used throughout the entire shutter actuation mechanism, beyond the advantageous use of lighter, less stiff shutter blades. Relatedly, smoothness of actuation, at any speed, is of concern with regard to repeatability. That is, repeatability is represented by a tolerance value for the time that is required to open or close the shutter arrangement. Higher repeatability translates directly into more reproducible process results. Accordingly, for precision process applications that require high reproducibility, the use of dual-end shutter drive is generally contemplated in any suitable embodiment.

Attention is now directed to FIG. 20 which illustrates still another embodiment of a shutter arrangement, generally indicated by the reference number 600 and produced in accordance with the present invention. Shutter arrangement 600 cooperates with a lamp array 602 that is comprised of an array of lamps 102 so as to define heating plane 104. A workpiece (not shown) may be supported, for example, in a manner that is consistent with that previously described for system 100 of FIGS. 3 and 4. Moreover, a showerhead arrangement may be interposed between lamps 102 and the workpiece such as, for example, showerhead arrangement 120 of FIGS. 3 and 4. For purposes of brevity, descriptions of the workpiece and the showerhead arrangement will not be repeated.

Still referring to FIG. 20, shutter arrangement 600 includes a shutter blade support plate 604 defining a plurality of spaced-apart slots 606, each of which receives an end portion of one of a plurality of shutters 608. The shutter blades are individually indicated as 608a–j. The shutter blade support plate is only partially shown in two different vertically offset positions in order to illustrate various operational conditions, however, it is to be understood that all of the shutter blades can be supported by a single shutter support plate for movement in unison. The shutter blade support plate is movable toward and away from a reflector plate 610, as indicated by a double-headed arrow 612, in order to extend and retract the shutter blades. Leftmost shutter blade 608a is shown in a fully retracted position such that a lower end of shutter 608a is recessed in reflector plate 610 by a suitable distance 611 which, in the present example, is approximately 2.5 mm. In particular, the blade is recessed by an amount that is sufficient to block a direct view of the lamp filaments that correspond to lamps 102 directly below and to either side of shutter 608a.

A progressive extension of shutter blades 608 is shown from left to right in FIG. 20 such that blades 608b–c are extended only sufficient to bring the lower end of these blades into approximate alignment with a surface 614 of the reflector plate. Blades 608d–h illustrate incremental, further extension of the shutter blades from left to right, while blades 608i–j are shown in a fully extended position, as connected to support plate 604 positioned against reflector plate 610. In the present example, the fully extended shutter blades extend by a distance of approximately 40 mm from a lower reflector plate surface 614. In this regard, each lamp 102 includes a filament 616 that is indicated as dot. The filaments are approximately 12 mm from reflector plate surface 614 and spaced at approximately 16 mm apart. Accordingly, shutter blades 608 are spaced-apart by an amount that is equal to the lamp-to-lamp spacing of 16 mm. It is understood that all dimensions are given in the spirit of providing a description of one of many possible configurations that may be utilized by one having ordinary skill in the art in view of this disclosure and are intended in no way as being limiting. It should be appreciated that a shutter configuration may be provided wherein a shutter is not necessarily located between every adjacent pair of lamps, for example, shutters can be positioned between every other pair of lamps.

Figure 21:
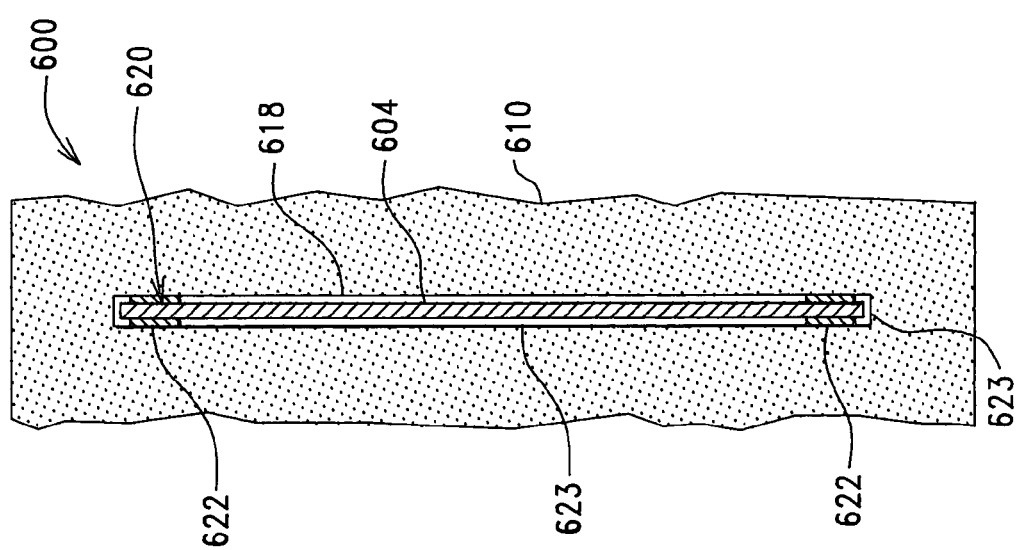
FIG. 21 is a diagrammatic, bottom view of a portion of the shutter arrangement of FIG. 20 showing a reflector plate with one shutter slot and shutter positioned therein.

Turning to FIG. 21 in conjunction with FIG. 20, the former illustrates a diagrammatic plan view of one shutter 608 in one slot 618 defined by reflector plate 610 (which is only partially shown) and taken from the viewpoint of lamps 102. Each slot 618 can include a bearing arrangement 620. In the present example, the bearing arrangement includes two pairs of bearing members 622 such that one pair is arranged at each opposing end of shutter 608. Bearing members may be formed, for example, from any suitable high temperature polymer such, as for example fluorocarbon related polymers, carbon, graphite glassy carbon, diamond coated ceramic. As an alternative, metal and dry or liquid lubricant impregnated porous materials may be used. Accordingly, at locations away from the bearing members, shutter blade 608 is spaced away from the periphery of slot 606 by a distance that is approximately equal to the thickness of bearing members 622 so as to define peripheral passages 623 surrounding the shutter blade. The bearing members may be formed in any suitable manner such as, for example, along the entire thickness of reflector plate 610, at positions adjacent to the major, opposing surfaces of the reflector plate and/or at spaced apart positions along the thickness of the reflector plate. In this way, so long as support plate 604 is not positioned against reflector plate 610, in the fully extended shutter positions, cooling gas can pass through peripheral passages 623 surrounding each shutter blade. This cooling gas serves not only to cool the shutter blades but, thereafter, to cool additional components such as, for example, a showerhead or window arrangement therebelow (see, for example, FIGS. 3 and 4).

Any suitable actuation mechanism may be utilized such as, for example, at least one linear actuator 626 having an actuator shaft 628 that is connected to shutter support plate 604 for movement thereof for moving the plate in the directions indicated by double-headed arrow 612. Any suitable number of actuators may be utilized to move support plate 604 or to move individual ones of the shutters. In view of the need for only linear motion, it is considered that one of ordinary skill in the art may readily provide any number of suitable actuation mechanisms in view of this overall disclosure.

Suitable materials for forming shutter blades 608 include but are not limited to aluminum, stainless steel, titanium, plated beryllium, ceramic, carbon based composite and suitable combinations. Reflector plate 610 may be formed, for example, from aluminum, stainless steel, titanium and suitable combinations while shutter blade support plate 604 may be formed, for example, using aluminum, titanium and suitable combinations. Shutter blades 608 may be fixedly received in shutter blade support plate 604, for example, by mechanical fixturing, epoxy, compression fitting, metallic bonding. The shutter blade major surfaces should be radiation absorbing in coloration or configuration so as to absorb as much lamp radiation as possible when the shutters are extended, while their lowermost ends should be radiation reflective in coloration or configuration so as to absorb as little radiation as possible when the shutters are retracted. Such colorations and configurations can be achieved in any suitable manner such as, for example, through the use of coatings. It is noted that, within a particular shutter arrangement in any embodiment described herein, different shutters or subsets of shutters may be of different lengths and/or fabricated from different materials.

In the instance of using heating/shutter arrangements both above and below (not shown) a workpiece, it may be advantageous to rotate one heating/shutter arrangement in its major plane by approximately 90 degrees with respect to the other heating/shutter arrangement, at least for the purpose of minimizing any optical effects that are attributable to the shutter blade slots.

It is considered to be advantageous to use lamps 102 which have the fastest possible cooling response. While this is applicable to all embodiments described herein, it is particularly appropriate with respect to shutter arrangement 600, as well as the embodiment described immediately hereinafter, since there is at least some limited direct exposure of the workpiece to direct radiation with the shutters fully extended, as will be further described.

Having described the structure of shutter arrangement 600 in detail above, its operation will now be described in detail. Initially, it is noted that the design of shutter arrangement 600 has been executed in way that is intended to minimize issues related to shutter blade deformation. For example, deformation resulting from the shutter blade fabrication process or deformation resulting from thermal stress arising from energy absorbed by shutter blades while exposed to energy from the lamps and other thermal transfer surfaces or deformation arising from acceleration of the shutter blade during blade extension. Thermal transfer surfaces include any surfaces such as, for example, chamber surfaces that are subject to radiation absorption and re-radiation within the processing chamber. It should be appreciated that shutter blades 608 partially block direct radiation 620 from reaching a workpiece that is positioned below the shutter arrangement, as seen in the view of FIG. 20. Based on the illustrated geometry, however, these shutters block a remarkable amount of the lamp radiation in their extended positions. As is illustrated with respect to lamp 102*j*, only that radiation which is emitted by lamp 102*j* into an angle $\alpha$ is potentially directly incident on a workpiece therebelow, while a smaller angular range of emitted radiation, denoted by the angle $\beta$, is potentially reflected from reflector plate surface 614 back towards a workpiece. It is submitted that approximately 87% (315°/360°) of the direct lamp radiation is captured by the shutter arrangement, if the shutter blades are assumed to be perfectly absorbing and for the contemplated dimensions. Of course, this figure is readily adjustable with appropriate dimensional modifications. This performance is considered as no less than remarkable in view of the overall simplicity of the shutter arrangement, particularly with respect to the need for only linear movement of the shutters. During such movement, any concern with respect to interference between adjacent ones of the shutters is eliminated, as well as rotationally derived interference concerns. Moreover, extremely rapid movement of the shutters is facilitated by the configuration of shutter arrangement 600 at least for the reasons that the movement is linear and each shutter is fully engaged along its length by support plate 604. The overall result is a highly effective, yet dramatically simple shutter arrangement.

The configuration of shutter arrangement 600 may be modified in a number of ways with various objectives in mind. For example, a non-linear lamp array may used with shutters of different extension lengths determined based on the configuration of the lamp array. As another example, tuning of the heating profile may be accomplished by adjusting the extension length, either with a fixed distribution, or with a dynamically configured distribution. That is, all of the blades can be extended by an equal amount and/or different blades may be extended by different amounts. As still another example, there is no requirement for the shutter blades to extend normal to the reflector plate. The latter may be useful in increasing the degree of direct radiation blocking, and for uniformity tuning purposes.

Figure 22A:
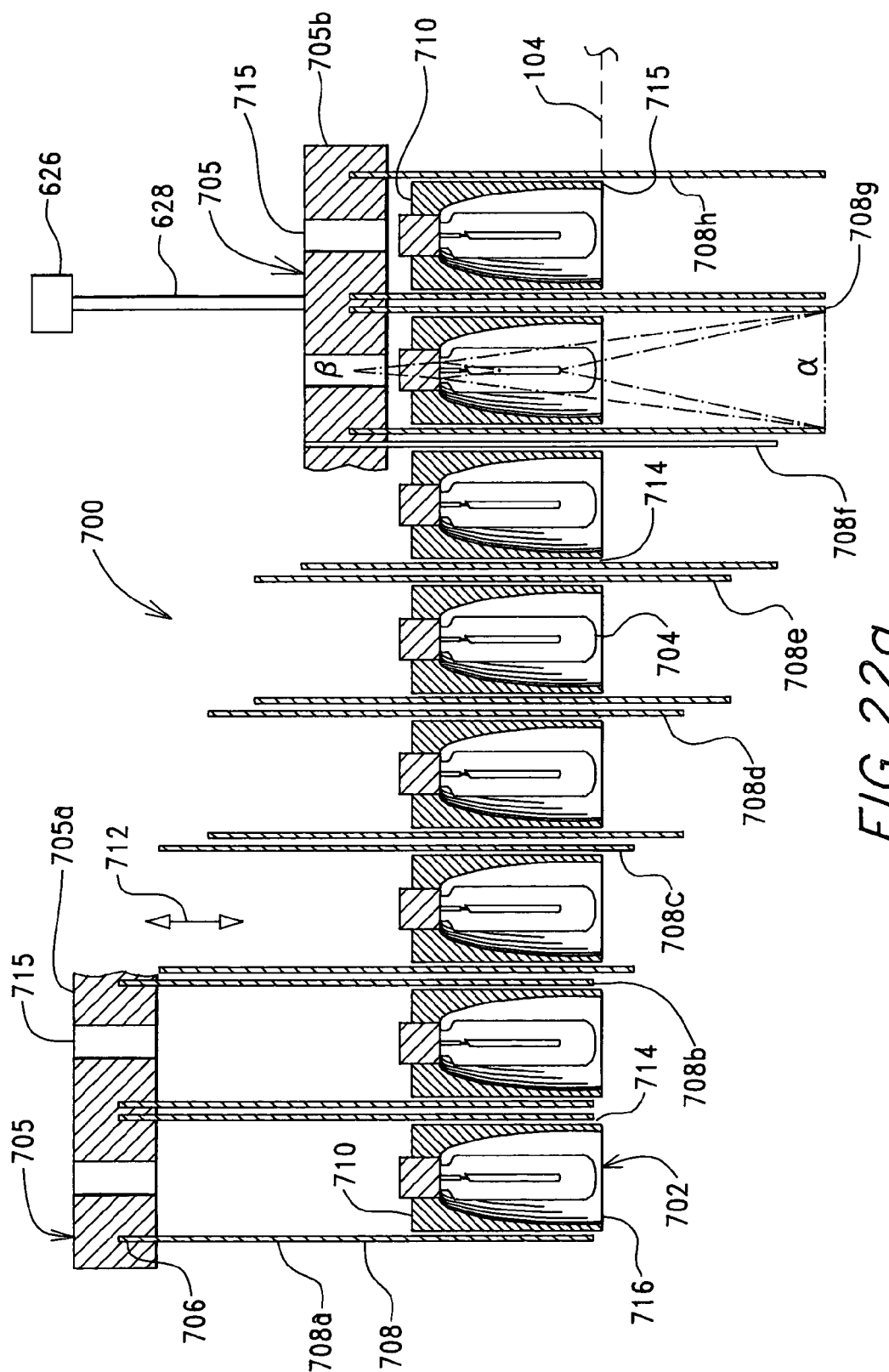
FIG. 22a is a diagrammatic partially cut-away view, in elevation, of another embodiment of the shutter arrangement of the present invention shown here to illustrate a highly advantageous tubular shutter implementation.

Turning now to FIG. 22*a* which illustrates yet another embodiment of the shutter arrangement and system of the present invention, generally indicated by the reference number 700. Shutter arrangement 700 cooperates with a lamp array 702 that is comprised of an array of lamps 704 so as to define heating plane 104. Lamps 704 are arranged in an end-on configuration. The present example contemplates tubular shutters in combination with tungsten-halogen lamps having a projection configuration. Tubular configured lamps may be employed in this form of array, having electrical connections at each opposing end of the tube, with appropriate reflector configurations arranged about each tubular lamp. As an example, U.S. Pat. No. 5,155,336 shows a configuration of "light pipes". In this regard, it is considered that any form of lamp having an elongated filament or any form of lamp having a point-source emanation of radiation, surrounding envelope and associated reflector may be used with tubular shutters by arranging the filament transverse to the major surface of the workpiece. Shutters may extend either between each shutter and its associated reflector or surrounding one or more such arrangements. A workpiece (not shown) may be supported, for example, in a manner that is consistent with that previously described for system 100 of FIGS. 3 and 4. Moreover, a showerhead and window arrangement may be interposed between lamps 704 and the workpiece such as, for example, showerhead arrangement 120 of FIGS. 3 and 4. For purposes of brevity, descriptions of the workpiece and the showerhead arrangement will not be repeated.

Continuing to refer to FIG. 22*a*, shutter arrangement 700 includes a shutter blade support plate 705 defining a plurality of spaced-apart shutter receiving slots 706, each of which is configured to receive an end portion of one of a plurality of tubular shutters 708. In the present example, each shutter receiving slot is annular in shape and each tubular shutter member 708 is cylindrical in configuration, although this is not a requirement. For example, any suitable closed shape may be employed including a continuous surface such as a tubular surface of revolution (for instance, an elliptical shape) or a closed polygonal shape such as a triangle, rhombus, hexagon, a square or a rectangular configuration. It is noted that the present figure illustrates a linear distribution of tubular shutters and lamps, for purposes of enhancing the reader's understanding, although any appropriate distribution of lamps and tubular shutters may be employed, as will be further described.

Shutter blade support plate 705 is only partially shown in two different vertically offset positions, indicated by 705*a* and 705*b*, in order to illustrate various operational conditions, however, it is to be understood that all of the tubular shutter blades can be supported by a single shutter support plate for movement in unison. The shutter blade support plate is movable toward and away from a reflector plate 710, as indicated by a double-headed arrow 712, in order to extend and retract the shutter blades. At least one actuator such as, for example, linear actuator 626 having its actuator shaft 628 connected to support plate 705 may be used. Again, any suitable configuration of actuators may be used in order to accomplish the desired motion. A leftmost portion 705*a* of the shutter blade support plate is shown in a fully retracted position such that a lower end of shutter 708*a* is recessed in reflector plate 710 by a suitable distance, in the present example, this distance is approximately 2.5 mm. Reflector plate 710 may, for example, be coated with any suitable highly reflective material such as, for example, gold, aluminum, barium sulphate, titanium oxide, aluminum oxide and other various oxides, and combinations thereof.

A continuous annular slot 714 is formed surrounding each lamp so as to permit one of tubular shutters 708 to move therethrough. Each slot 714 may have a width which permits cooling gas such as, for example, air to pass through the slot in a downward direction in the view of the figure. This cooling gas passes through a group of openings 715 defined by support plate 705 and then enters slots 714. After cooling the tubular shutters and reflector plate 710, the gas may then impinge on a window/showerhead arrangement therebelow (see FIGS. 3 and 4). A lamp receiving pocket 716, having a reflective inner surface, is formed to receive each lamp 704. The reflective inner surface may be formed, for example, by coatings (using materials listed in the paragraph immediately foregoing) or through the use of a formed material, although it should be remembered that a reflector is not required.

A progressive extension of tubular shutter blades 708 is shown from left to right in FIG. 22*a* having blades 708*a–b* retracted. Blades 708*c–f* illustrate incremental, further extension of the shutter blades from left to right, while blades 708*g–h* are shown in a fully extended position, with the support plate, indicated by the reference number 705*b*, positioned nearly against reflector plate 710 in a manner which provides for a continuous flow of cooling gas. If it is desired to block the cooling gas flow, reflector plate 710 and support plate 705 may be configured to cooperatively engage one another to accomplish this.

Figure 22B:
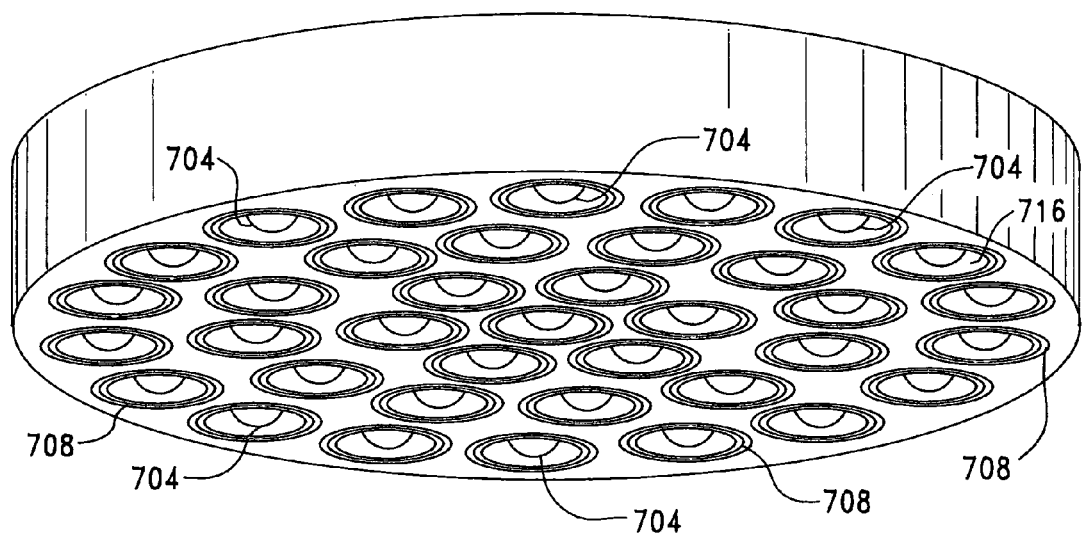
FIG. 22b is a diagrammatic bottom view, in perspective, showing another embodiment of the shutter arrangement of FIG. 22a, having its shutters in retracted positions.
Figure 22C:
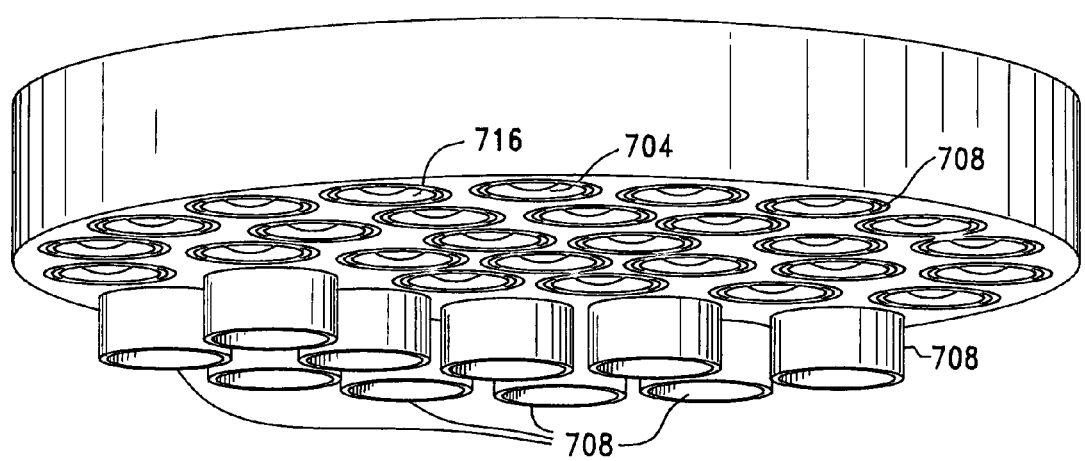
FIG. 22c is another diagrammatic bottom view, in perspective, showing the shutter arrangement of FIG. 11b, having selected shutters shown in their extended positions.

Referring to FIGS. 22*b* and 22*c* in conjunction with FIG. 22*a*, the former figure illustrates shutters 708 in retracted positions in a bottom perspective view of another embodiment of the tubular shutter arrangement of FIG. 22*a*. FIG. 22*c* illustrates selected ones of shutters 708 in extended positions, although it is understood that all of the shutters are simultaneously extendable. It should be appreciated that each shutter 708 defines an interior which at least partially receives one heating element when moving from the retracted position to the extended position. Of course, alternatives can be presented which cause at least a portion of each heating element to be outside of the interior of each shutter at certain times during shutter movements. For example, the tubular shutters can be pulled completely out of reflector plate 705 in their retracted positions. As another example, the tubular shutters can be supported by support members which extend from support plate 705 to a main tubular body of each shutter, defining the interior of the shutter, such that the heating element is at least partially outside of the shutter interior when the shutter is in its fully extended position.

In the present example, the fully extended shutter blades extend by a distance of approximately 45 mm from a lower reflector plate surface 715. The diameter of each tubular shutter blade is approximately 25 mm. It is understood that all dimensions are given in the spirit of providing a description of one of many possible configurations that may be utilized by one having ordinary skill in the art in view of this disclosure and are intended in no way as being limiting. Based on this geometry, defining small angles $\alpha$ and $\beta$, as illustrated with respect to fully extended tubular shutter 708*g*, it is submitted that the shutters serve to block a significant portion of the light which would otherwise be incident on the workpiece with the shutters fully retracted. It should be appreciated that this figure may readily be adjusted, in view of this overall disclosure, with changes in shutter diameter and extended length. Moreover, it is noted that the shutters, in their extended positions, as is the case with all embodiments described herein, also absorb energy reflected from and emitted from the workpiece as well as the chamber.

Figure 23:
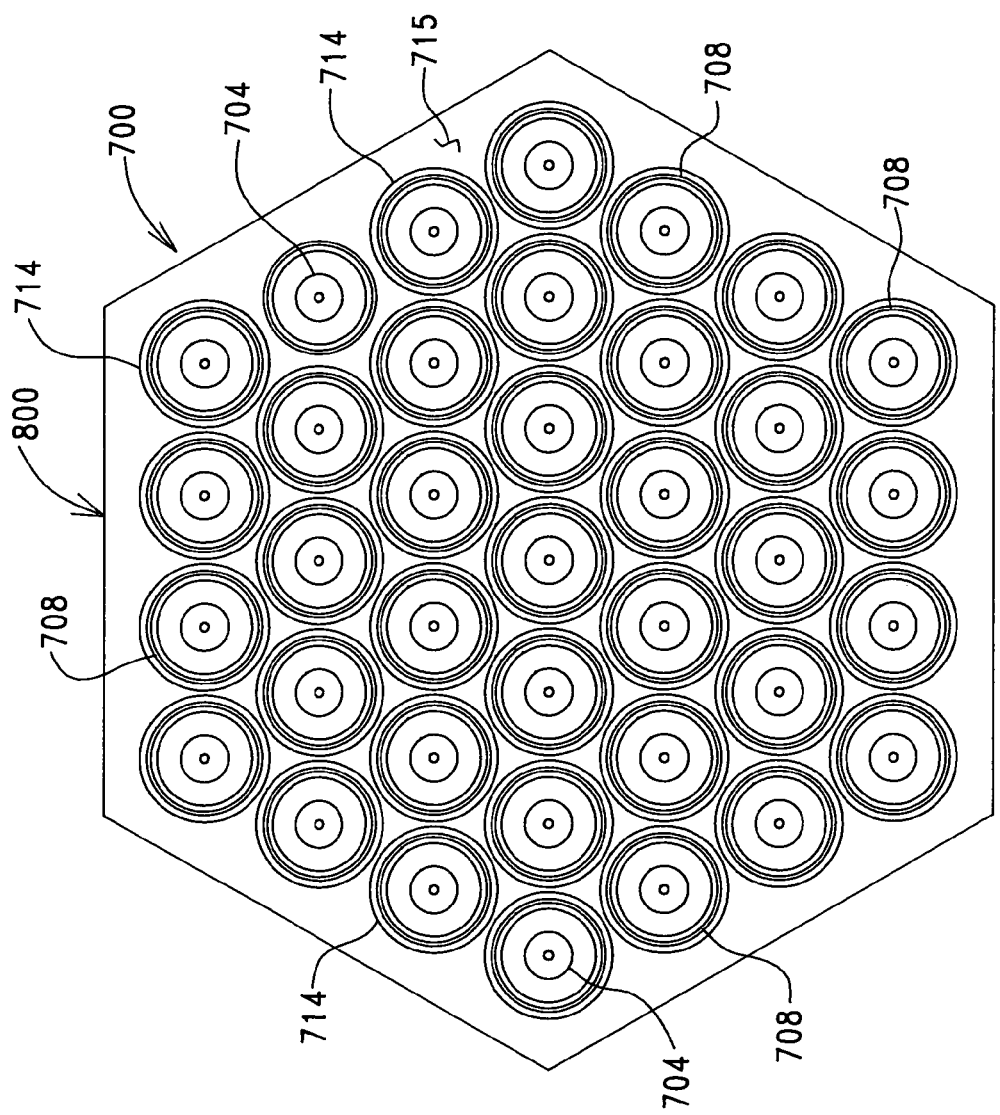
FIG. 23 is a diagrammatic, bottom view of one implementation that is based on the tubular shutters of FIG. 22a, shown here to illustrate an alternative distribution of tubular shutters and associated heating elements in a way which approximates a circular, planar heat source.

Referring to FIG. 23, a plan view of an alternative distribution of lamps and tubular shutters is illustrated for use in shutter arrangement 700. It should be appreciated that a primary difference, with respect to the implementation of FIG. 22*a*, resides in the lamp/shutter distribution. In this implementation, a hexagonally shaped array 800 of lamps 704 and tubular shutters 708 is provided. At least to an acceptable approximation, this distribution may be considered as providing a circular heat source so as to accomplish uniform workpiece heating and cooling.

Suitable materials for forming tubular shutter blades 708 include but are not limited to aluminum, stainless steel, titanium, plated beryllium, graphite composite/laminate materials and suitable combinations. Reflector plate 710 may be formed, for example, from aluminum, stainless steel, titanium, copper and suitable combinations while shutter blade support plate 705 may be formed, for example, using aluminum, stainless steel, titanium, and suitable combinations. Shutter blades 708 may be fixedly received in shutter blade support plate 705, for example, by mechanical fixturing, epoxy, compression fitting and metallic bonding. At least the shutter blade inner major surface should be radiation absorbing for the lamp or heat source energy. The inner surface may also be configured to absorb the radiation emitted by the workpiece and other energy transfer surfaces, although this is not a requirement. The lowermost end surface of each tubular shutter should be radiation reflecting at least for the lamp or heat source radiation so as to absorb as little radiation as possible when the shutters are retracted. It may be preferred that the outer major surface of each shutter is radiation absorbing so as to absorb radiation reflected and emitted from the workpiece. As described above, coatings are one way in which these properties may be provided, although any number of suitable alternative implementations may be utilized such as, for example, absorbing or reflective properties of a bulk material from which the component of interest is formed.

The configuration of shutter arrangement 700 may be modified in a number of ways with various objectives in mind. For example, shutters of different extension lengths can be used based on the configuration of the lamp array and/or to produce more uniform cooling. As another example, tuning of the heating profile may be accomplished by adjusting the extension length, either with a fixed distribution, or with a dynamically configured distribution. That is, all of the blades can be extended by an equal amount and/or different blades may be extended by different amounts, even at different times.

Generally, with respect to the shutter arrangements of the present invention, the use of non-uniform shutter configurations is contemplated, for example, in which the shutter arrangement does not impede lamp radiation in the same way or to the same degree across the entire shutter array, so as to allow for uniformity adjustments. As another example, shutter arrangements are contemplated wherein there is more than one actuation mechanism so as to drive different subsets of the shutters, again for uniformity tuning.

Having described a number of embodiments of the present invention in detail above, it is worthwhile to now draw several comparisons with the prior art. Unlike the prior art, as embodied, for example, by Pas, the shutter of arrangement of the present invention completely avoids shadowing on the workpiece when the shutters are in retracted (open) positions. It is important to understand, in this regard, that this advantage is provided along with the capability to extend (close) or retract (open) the shutters in a way which provides a highly uniform heat exposure to the workpiece. That is, in contrast to the use of a one-piece shutter that simply slides into a position between the heat source and the workpiece, the shutter arrangement of the present invention provides for implementation of a heat treatment process by beginning and/or ending the process essentially uniformly across the entire surface of the workpiece. By adjusting the speed as well as the start time of the shutter blade extension in relationship to the time that the lamps are turned off or to some other appropriate event such as, for example, a temperature reading of the workpiece, the shape of the thermal profile can be varied to achieve greater control of the time-temperature profile than previously obtainable. The combination of these advantages—uniformity without shadowing—is considered to provide sweeping advantages over the existing state-of-the-art.

Figure 24:
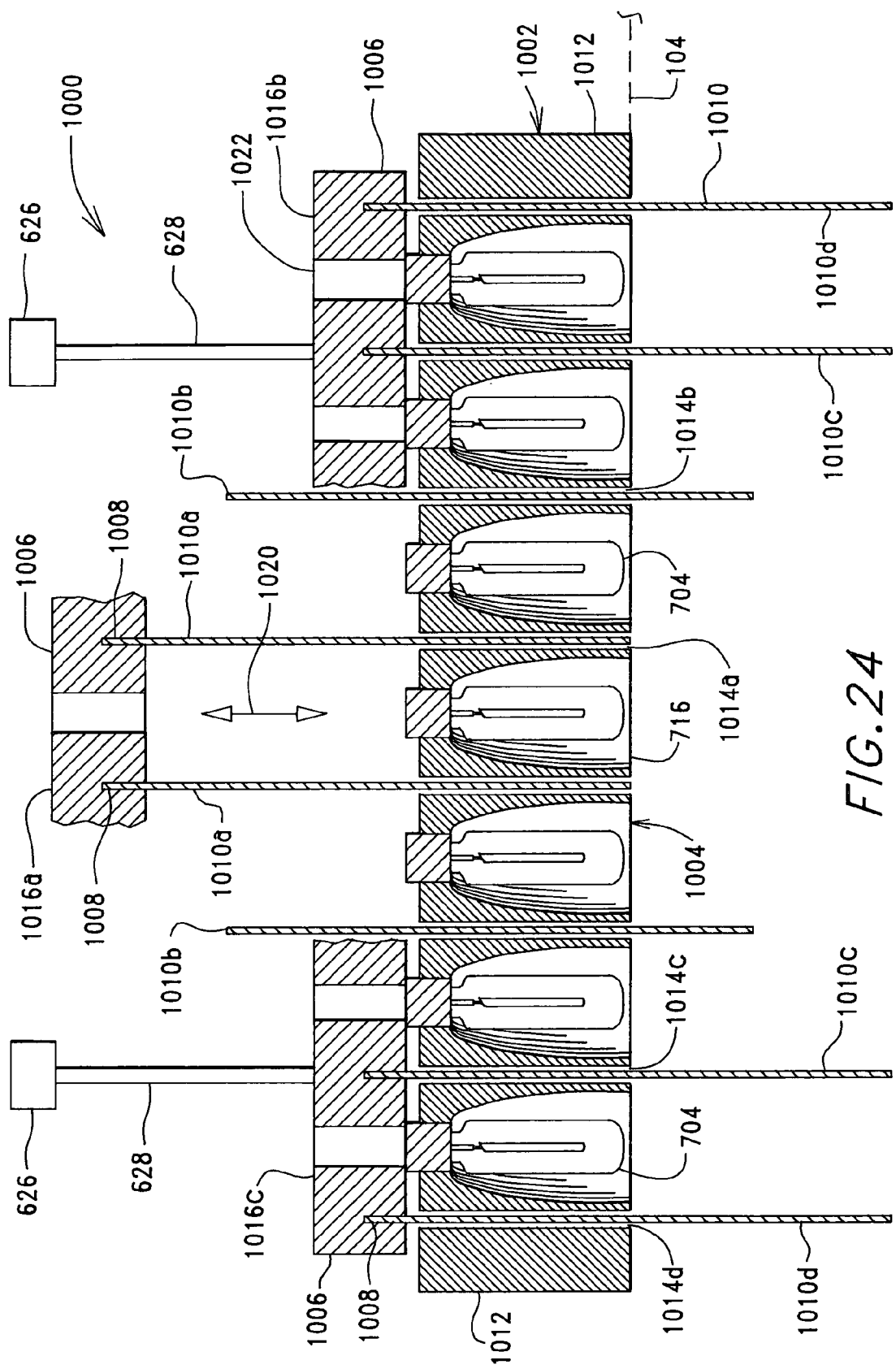
FIG. 24 is a diagrammatic partially cut-away view, in elevation, of a further embodiment of the shutter arrangement of the present invention shown here to illustrate a concentric tubular shutter configuration and cooperating circular lamp array.
Figure 25A:
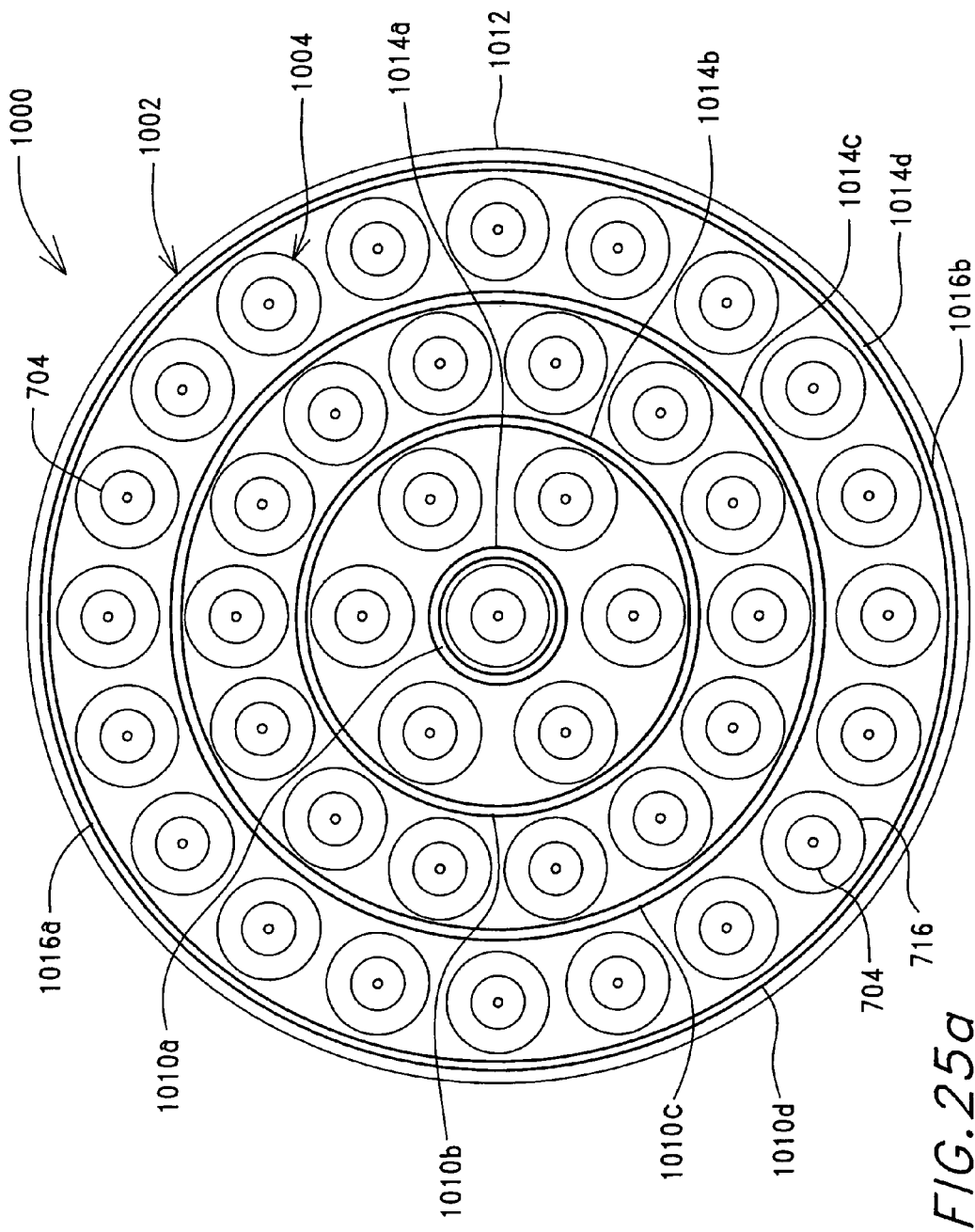
FIG. 25a is a diagrammatic, bottom view of the shutter arrangement of FIG. 24, in perspective, shown here to illustrate further details of its structure.

Turning now to FIGS. 24 and 25*a*, a further embodiment of a system, produced in accordance with the present invention, is generally indicated by the reference number 1000. System 1000 includes a shutter arrangement 1002 which cooperates with a circular lamp array 1004 (best seen in FIG. 25*a*) that is comprised of an array of lamps 704 so as to define heating plane 104. As described above, lamp receiving pocket 716, having a reflective inner surface, is formed to receive each lamp 704. It should be appreciated that a uniform planar, circular heat source is suitably approximated. As described above, tubular shutters may be used with other forms of elongated lamps, including in a light pipe configuration (not shown), that are arranged transverse or normal to the major surface of the workpiece. A workpiece (not shown) may be supported, for example, in a manner that is consistent with that previously described for system 100 of FIGS. 3 and 4. Further, a showerhead and window arrangement may be interposed between the lamp array and the workpiece such as, for example, showerhead arrangement 120 of FIGS. 3 and 4.

Continuing to refer to FIGS. 24 and 25*a*, shutter arrangement 1002 includes a shutter blade support plate 1006 (seen in FIG. 24) defining a plurality of spaced-apart concentric shutter receiving slots 1008, each of which is configured to receive an end portion of one of a plurality of tubular shutters 1010. These shutters are cylindrical in configuration, although this is not a requirement, and concentric such that shutter 1010*a* includes the smallest diameter and is arranged about an innermost one of lamps 704 within the circular lamp array. It should be appreciated, however, that a center lamp is not a requirement. Shutters 1010*b–d* include progressively larger diameters so as to encompass progressively greater numbers of lamps 704. A reflector plate 1012 defines a series of annular shutter receiving slots 1014*a–d*, each having a progressively larger diameter and each for receiving a corresponding one of shutters 1010 in a way which allows the shutter to be movable therethrough for purposes of extension and retraction. As is the case with embodiments described above, any suitable closed shape may be employed for the shutters and reflector plate receiving slots (with an appropriately configured lamp array) including a continuous surface such as a tubular surface of revolution (for instance, an elliptical shape) or a closed polygonal shape such as a triangle, rhombus, hexagon, a square or a rectangular configuration.

Shutter blade support plate 1006 is only partially shown in three different vertically offset positions, indicated by the reference numbers 1016*a–c*, in order to illustrate various operational conditions, however, it is to be understood that all of the tubular shutter blades can be supported by a single shutter support plate for movement in unison, although this is not a requirement. For example, one shutter can be moved individually and/or subsets of two or more shutters can be moved together. In the present example, shutter blade support plate 1006 is movable toward and away from reflector plate 1012 to move shutters 1010 through annular slots 1014, as indicated by a double-headed arrow 1020, in order to extend and retract all shutter blades in unison. A pair of actuators such as, for example, linear actuators 626 having actuator shafts 628 connected to support plate 1006 may be used. Again, any suitable configuration of actuators may be used in order to accomplish the desired motion. A center portion of the shutter blade support plate is shown in a fully retracted position 1016*a* such that a lower end of shutter 1010*a* is approximately flush with reflector plate 1012, although the lower shutter end may be slightly recessed in this position, as described above with regard to shutter arrangement 700. Reflector plate 1012 may, for example, be coated with any suitable highly reflective material as described, for example, with regard to shutter arrangement 700.

Each annular shutter receiving slot 1014 may have a width which permits cooling gas such as, for example, air to pass through the slot in a downward direction in the view of the figure. This cooling gas initially enters through a group of openings 1022 defined by support plate 1006 and then enters slots 1014. After cooling the tubular shutters and reflector plate 1012, the gas may then impinge on a window/showerhead arrangement therebelow (see FIGS. 3 and 4).

A progressive extension of tubular shutter blades 708 is shown in FIG. 24 having shutter 1010a fully retracted. Shutter 1010b is shown at an intermediate position between full extension and retraction. Shutters 1010c and 101d are fully extended such that support plate 1006 contacts reflector plate 1012 in a manner which blocks flow of cooling gas. Blocking cooling gas flow in this and other embodiments may serve to reduce physical and/or thermal stress on components such as, for example, the window separating the shutters from the process environment or the showerhead. If it is desired to provide for cooling gas flow, a space may be provided between the reflector plate and support plate even when the shutters are fully extended.

Figure 25B:
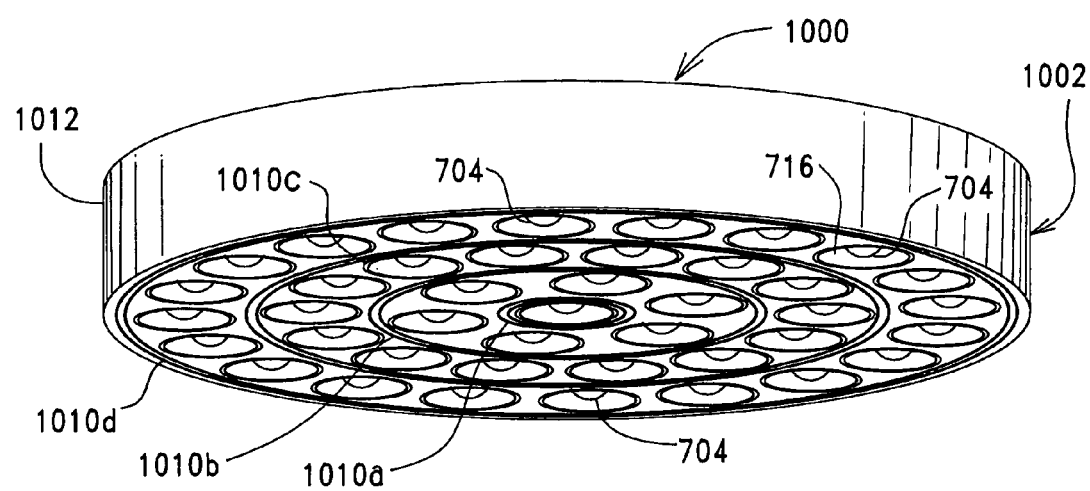
FIG. 25b is a diagrammatic bottom view, in perspective, showing an embodiment of the shutter arrangement of FIG. 25a, having its shutters in retracted positions.
Figure 25C:
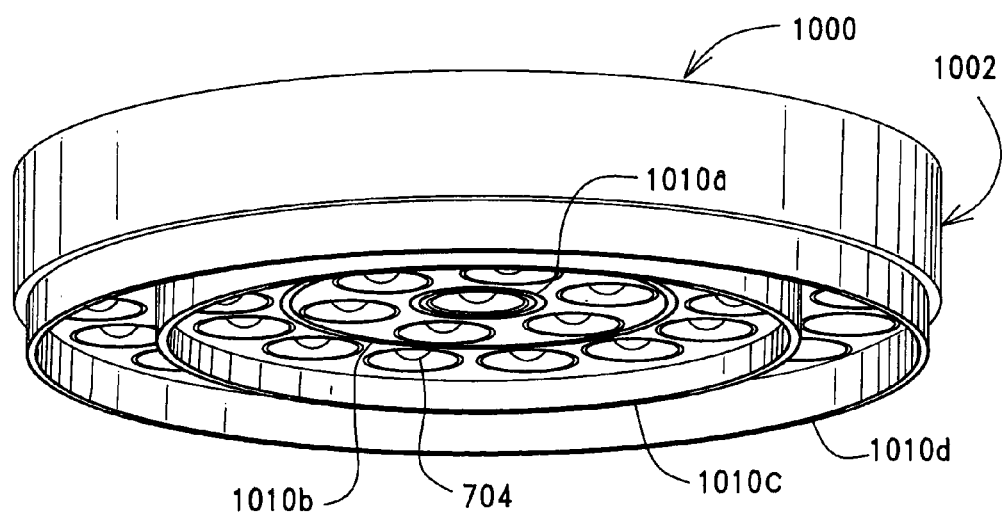
FIG. 25c is another diagrammatic bottom view, in perspective, illustrating the shutter arrangement of FIG. 25b having selected ones of its shutters shown in extended positions.

Referring to FIGS. 25b and 25c, the former figure illustrates shutters 1010 in retracted positions, in a bottom perspective view. FIG. 25c illustrates selected ones of the shutters in extended positions, although it is to be understood that all of the shutters are simultaneously extendable.

Referring to FIGS. 24 and 25a–c, it should be appreciated that each shutter 1010 defines an interior which at least partially receives at least one heating element when moving from the retracted position to the extended position, as described with respect to tubular shutter arrangement 700. Alternative configurations may also be used, as is also described above with reference to tubular shutter arrangement 700. In the present example, lamps 704 are arranged in concentric circles with a tubular shutter configured for extending between each concentric circle of lamps. Thus, the shutters are progressively larger in diameter by a distance which corresponds to the addition of one circular subset of lamps. It is noted that a tubular shutter is not required between every successive concentric ring of lamps 704 based, for example, on performance objectives.

In the present example, the fully extended shutter blades extend by a distance of approximately 45 mm from a lower reflector plate surface 715. The diameter of each tubular shutter blade is approximately 25 mm. It is understood that all dimensions are given in the spirit of providing a description of one of many possible configurations that may be utilized by one having ordinary skill in the art in view of this disclosure and are intended in no way as being limiting. Based on this geometry, some advantageous amount of direct radiation is blocked by the shutter arrangement. Of course, this figure can be adjusted up or down with appropriate modifications in the geometry such as, for example, changing shutter-to-shutter diameter spacing and extended length. Moreover, it is noted that the shutters, in their extended positions, as is the case with all embodiments described herein, also absorb energy reflected from and emitted from the workpiece as well as the chamber.

Suitable materials for forming tubular shutter blades 1010 include those materials described above, for example, with reference to the tubular shutters of shutter arrangement 700. Likewise the use of materials described above is equally applicable with respect to other components of shutter arrangement 1000. Shutter blades 1010 may be fixedly received in shutter blade support plate 1006, for example, by mechanical fixturing, epoxy, compression fitting and metallic bonding. Both major surfaces of each shutter blade may be configured as radiation absorbing for the lamp or heat source energy as well as the radiation emitted by the workpiece and other energy transfer surfaces. The lowermost end surface of each tubular shutter should be radiation reflecting at least for the lamp or heat source radiation, so as to absorb as little radiation as possible when the shutters are retracted. As described above, coatings as well as any other suitable alternative may be utilized to achieve the desired response.

As is the case with shutter arrangement 700, the configuration of shutter arrangement 1000 may be modified in a number of ways with various objectives in mind as described, for example, in conjunction with the discussions of shutter arrangement 700.

With regard to lamp arrays such as shown in FIGS. 23 and 25, it should be understood that there is no requirement for a reflector arranged proximate to each lamp, let alone any reflectors at all. For example, an axisymmetric array of lamps can extend from a planar reflector. As another example, ring-like lamp configuration may be backed by a "trough"-like reflector. Tubular shutters, such as used in the subject figures, are equally applicable with respect to these designs. It is mentioned that a mesh configuration may be provided such as, for example, a honeycomb configuration wherein all of the tubular shutters are attached to one another or are integrally formed for movement in unison. Such a mesh configuration is nonetheless considered to be a segmented radiation shield so long as it is movable through the heating element array.

Referring to FIG. 25a, it should be appreciated that any tubular shutter can be segmented into two or more segments which cooperate to define an overall configuration and interior. As an example, shutter 1010d could be segmented at lines 1016a and 1016b so as to divide the shutter in two halves.

Figure 26:
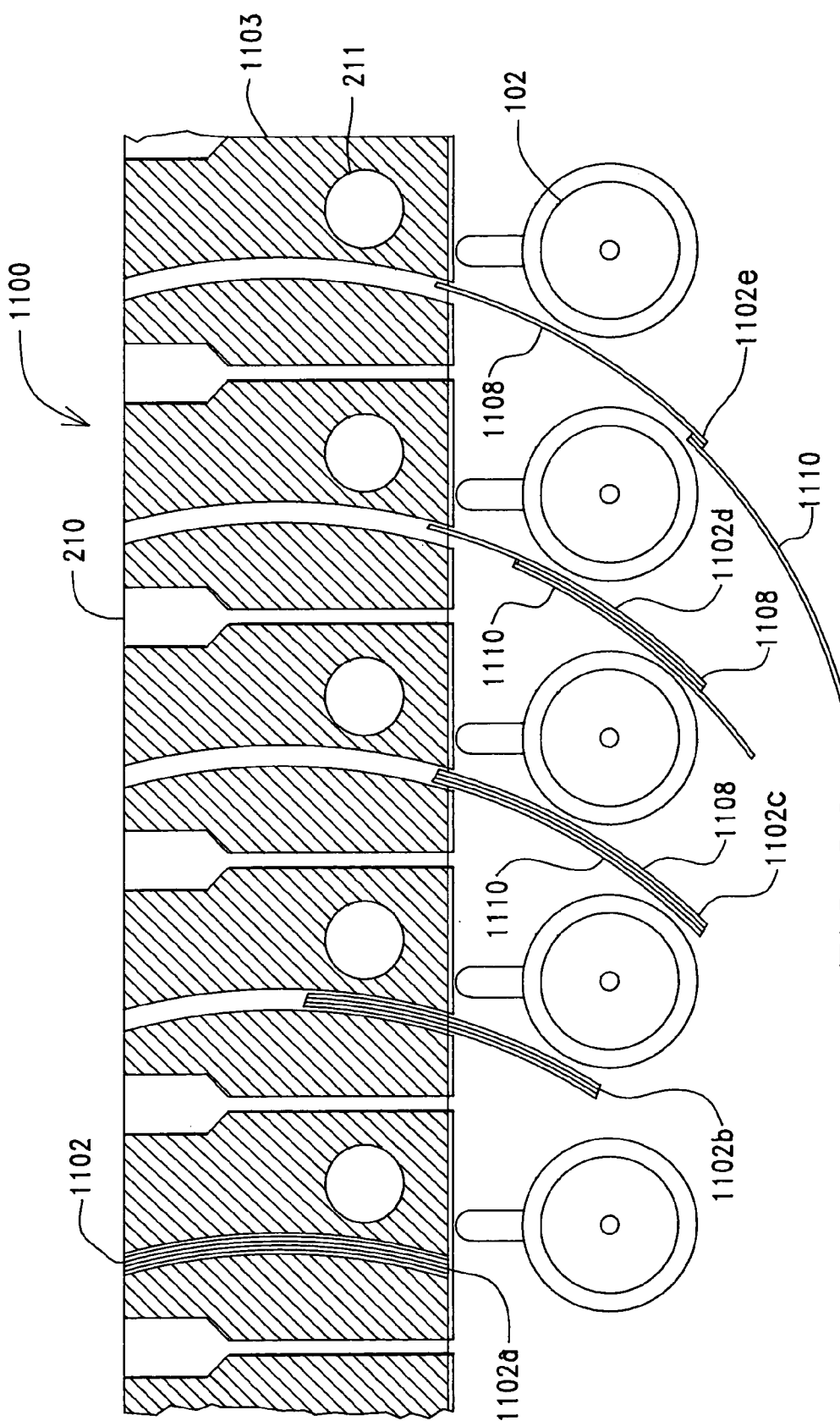
FIG. 26 is a diagrammatic view, in cross-section, showing a shutter arrangement that is produced having a dual-segment shutter blade further illustrating progressive extension of one shutter segment with respect to the other.

Referring to FIG. 26, an additional embodiment of a shutter arrangement, produced in accordance with the present invention, is generally indicated by the reference number 1100. It is noted that this embodiment is most closely relate to embodiments described above such as shown in FIGS. 3–19 in which arrays of elongated lamps are arranged with their elongation axes at least generally aligned with the major surface of the workpiece and the shutters move between at least certain adjacent ones of the lamps. Hence, details already provided above with respect to this arrangement will not be repeated for purposes of brevity. It is of interest, however, that shutter arrangement 1100 includes a segmented shutter blade configuration 1102 that is supported and housed by a reflector plate 1103. In the present example, each shutter blade 1102 includes a two-segment configuration. A progressive extension of shutters 1102 is shown from left to right in the view of the figure. A shutter 1102a is fully retracted in reflector plate 1106. Shutter 1102b is moving out of the reflector plate. Shutter 1102c has emerged from the reflector plate having a first segment 1108 and a second segment 1110 remaining in a fixed relationship with respect to one another. Shutter 1102d is shown having its segment 1110 moving away from its segment 1108 during further extension. Shutter 1102e illustrates full extension of shutter segment 1110 with respect to its segment 1108. It should be appreciated that relative motion between the shutter segments may occur at any time during the extension/retraction process and that the illustrated embodiment is in no way intended as being limiting.

Although each of the aforedescribed physical embodiments have been illustrated with various components having particular respective orientations, it should be understood that the present invention may take on a variety of specific configurations with the various components being located in a wide variety of positions and mutual orientations. Furthermore, the methods described herein may be modified in an unlimited number of ways, for example, by reordering, modifying and recombining the various steps. Accordingly, it should be apparent that the arrangements and associated methods disclosed herein may be provided in a variety of different configurations and modified in an unlimited number of different ways, and that the present invention may be embodied in many other specific forms without departing from the spirit or scope of the invention. Therefore, the present examples and methods are to be considered as illustrative and not restrictive, and the invention is not to be limited to the details given herein, but may be modified at least within the scope of the appended claims.

What is claimed is:

1. In a system for processing a workpiece by applying controlled heat thereto, an apparatus comprising:
a heating arrangement defining a heating plane using an array of heating elements in a confronting relationship with said workpiece to subject the workpiece to a direct radiation that is produced by the heating arrangement;
a segmented radiation shield including a plurality of segments supported for movement at least partially through said heating plane between (i) retracted positions, in which said direct radiation is allowed to reach said workpiece and (ii) extended positions, in which the plurality of segments cooperate in way which serves to at least partially block said direct radiation from reaching the workpiece such that at least certain ones of said segments move between adjacent ones of the heating elements in moving between said retracted positions and said extended positions; and
means for moving the plurality of segments between the retracted positions and the extended positions.

2. The apparatus of claim 1 wherein each of said heating elements defines a heating axis, such that the heating axes of all of the heating elements are in a side-by-side relationship and each of said segments is an elongated shutter member defining a shutter elongation dimension such that the elongation dimensions of the elongated shutter members are at least aligned with one another.

3. The apparatus of claim 2 wherein said heating axis of the heating elements and the shutter elongation dimension of said elongated shutters are spaced apart in an at least generally side-by-side aligned relationship.

4. The apparatus of claim 2 wherein said workpiece includes a major surface to be exposed to the heating arrangement and the shutter elongation dimension is at least generally aligned in a side-by-side spaced apart relationship with the major surface of the workpiece.

5. The apparatus of claim 2 wherein said workpiece includes a major surface to be exposed to the heating arrangement and the shutter elongation dimension is at least generally transverse to the major surface of the workpiece.

6. The apparatus of claim 2 wherein the elongated shutter members are configured such that at least one elongated shutter member moves at least partially through the heating plane between adjacent ones of the heating elements while moving between the retracted position and the extended position for that shutter member.

7. The apparatus of claim 2 including a support arrangement which supports said heating elements and which defines a surface facing the heating arrangement, said support arrangement further defining a plurality of elongated shutter slots each of which includes a shutter opening, defined in said surface, such that each of said slots is configured for at least partially receiving one of the elongated shutter members in said retracted position.

8. The apparatus of claim 7 wherein said support arrangement includes a thickness that is normal to said surface and defines through said thickness a plurality of through holes, each of which includes an aperture formed in said surface for use in gas cooling at least said heating elements.

9. The apparatus of claim 7 wherein said support arrangement includes a thickness that is normal to said surface and defines within said thickness at least one cooling channel for containing a cooling fluid within the cooling channel.

10. The apparatus of claim 7 wherein each of said elongated shutter members includes a pair of opposing ends defining an elongation length therebetween and each opposing end is supported by a hinge arrangement including a hinging arm that is hingably connected with said support arrangement such that each elongated shutter member moves rotatably between its retracted position and its extended position.

11. The apparatus of claim 4 wherein each elongated shutter member, in the extended position, is locatable, at least in part, between the heating plane and the workpiece to cooperate with other ones of the shutter members for blocking said direct radiation.

12. The apparatus of claim 2 wherein each elongated shutter member is arcuate in cross-section in a plane that is transverse to an elongated dimension of each elongated shutter member.

13. The apparatus of claim 12 wherein each elongated shutter member includes a leading edge and a trailing edge and the leading edge of a particular elongated shutter member is proximate to an adjacent one of the elongated shutter members in said extended positions along a line of proximity that is between the leading edge and the trailing edge of the adjacent elongated shutter member.

14. The apparatus of claim 13 wherein the line of proximity is adjacent to the trailing edge of the adjacent shutter.

15. The apparatus of claim 2 wherein each elongated shutter member includes a leading edge and a trailing edge such that the leading edge confronts the heating arrangement at least with the shutter in said retracted position and said leading edge of at least one shutter includes a reflective coloration.

16. The apparatus of claim 2 wherein each elongated shutter member includes an inner surface which confronts said heating elements in said extended positions and said inner surface of at least one shutter supports a reflective material.

17. The apparatus of claim 2 wherein each elongated shutter member includes an outer surface which confronts said workpiece in said extended position and said outer surface of at least one shutter includes a radiation absorbing coloration.

18. The apparatus of claim 2 wherein said elongated shutter members rotate at least partially around respective ones of the elongated heating elements in moving between the retracted positions and the extended positions.

19. The apparatus of claim 2 wherein successive ones of said elongated shutter members move between alternate adjacent ones of the elongated heating elements.

20. The apparatus of claim 2 wherein each of said elongated shutter members is formed as a generally rectangular planar plate having a pair of opposing major surfaces with a thickness therebetween and having a pair of opposing ends defining said shutter elongation dimension therebetween and said moving means includes a pair of control arms, one pair of which is positioned at each opposing end of each elongated shutter member, and each of which control arms includes a control arm end that is pivotally attached to one of the elongated shutter members such that a controlled movement of each pair of control arms causes a pivotally attached one of the elongated shutter members to pivotally rotate with respect to that pair of control arms, in moving between said retracted position and said extended position.

21. The apparatus of claim 1 wherein said moving means is configured for moving all of said segments in unison between said retracted positions and said extended positions.

22. The apparatus of claim 1 wherein said heating arrangement includes said array of heating elements in a side-by-side relationship and wherein each of said segments move along an extension direction from a retracted position through said array of heating elements when moving from said retracted positions to said extended positions.

23. The apparatus of claim 22 wherein said extension direction is at least generally toward said workpiece from the retracted positions and each of said segments is a shutter member that is configured for extension toward said workpiece from said retracted position.

24. The apparatus of claim 23 wherein each of said shutter members is formed as an at least generally planar plate defining a major plane and said extension direction is at least generally aligned with said major plane and toward said workpiece.

25. The apparatus of claim 23 wherein each of said shutter members is formed having a tubular configuration defining a shutter interior such that at least one of said heating elements is at least partially received within said shutter interior of each shutter member as each shutter member moves from said retracted position to said extended position.

26. The apparatus of claim 25 wherein at least one of said shutter members is received within the shutter interior of another one of said shutter members.

27. The apparatus of claim 25 wherein said tubular configuration is cylindrical.

28. The apparatus of claim 22 wherein said heating elements are arranged in a series of concentric rings and said shutters are arranged concentrically such that from a center point of the array each successive one of the tubular shutters, outward from the center point, moves around a greater number of said concentric rings.

29. The apparatus of claim 1 wherein said moving means includes means for providing a controlled acceleration and deceleration of the segments moving between the retracted positions and the extended positions.

30. The apparatus of claim 2 wherein each shutter member defines a shutter plane and said movement means extends and retracts each shutter using linear movements toward and away, respectively, from the heating arrangement such that each shutter moves in its shutter plane.

31. The apparatus of claim 30 wherein each shutter defines a pair of opposing major surfaces and wherein at least one shutter includes a radiation absorbing coloration on both of said opposing major surfaces.

32. The apparatus of claim 30 wherein each shutter member includes a pair of elongated first and second opposing major edges and said first elongated major edge is captured by a support plate and said movement means moves the shutter members in unison by linearly moving said support plate toward and away from the heating arrangement.

33. The apparatus of claim 32 wherein said second, opposing major edge of at least one shutter moves through said heating plane when the shutter is moved between the retracted position and the extended position.

34. The apparatus of claim 33 wherein said second opposing edge of at least one shutter includes a radiation reflecting coloration.

35. The apparatus of claim 30 wherein said shutter arrangement includes a reflector plate confronting said heating arrangement on a side thereof which is opposite of said workpiece and defining a plurality of elongated shutter slots in said reflector plate such that each shutter moves in one shutter slot during extension and retraction thereof.

36. The apparatus of claim 35 wherein each shutter defines an overall exterior surface area and at least a selected one of said slots defines an interior periphery and wherein said reflector plate defines a plurality of bearing members in said selected slot for contacting a portion of said overall exterior surface area such that the overall exterior surface of the shutter, away from said bearing members, is spaced apart from the interior periphery of the slot in which it is received by approximately said bearing member thickness.

37. The apparatus of claim 36 wherein said shutter is spaced apart from the slot so as to define a plurality of cooling channels through which a cooling gas can flow to provide cooling at least for the selected shutter.

38. In a system for processing a workpiece by applying controlled heat thereto, a method comprising:
providing a heating arrangement defining a heating plane using an array of heating elements in a confronting relationship with said workpiece to subject the workpiece to a direct radiation that is produced by the heating arrangement; and
configuring a segmented radiation shield to include a plurality of segments supported for movement at least partially through said heating plane between (i) retracted positions, in which said direct radiation is allowed to reach said workpiece, and (ii) extended positions, which the plurality of segments cooperate in way which serves to at least partially block said direct radiation from reaching the workpiece such that at least certain ones of said segments move between adjacent ones of the heating elements in moving between said retracted positions and said extended positions.

39. The method of claim 38 wherein each of said heating elements is elongated in length, defining a heating axis, such that the heating axes of the heating elements are in a side-by-side relationship and each of said segments is provided as an elongated shutter member defining a shutter elongation dimension and including arranging the elongation dimension of the elongated shutter members at least generally aligned with one another.

40. The method of claim 39 including arranging the heat element axis of the heating elements and the shutter elongation dimension of said elongated shutters in a spaced-apart at least generally side-by-side aligned relationship.

41. The method of claim 40 wherein said workpiece includes a major surface to be exposed to the heating arrangement and including arranging the shutter elongation dimension at least generally aligned in a side-by-side spaced apart relationship with the major surface of the workpiece.

42. The method of claim 40 wherein said workpiece includes a major surface to be exposed to the heating arrangement and including arranging the heating axis of the heating elements and the shutter elongation dimension at least generally transverse to the major surface of the workpiece.

43. The method of claim 39 wherein the elongated shutter members are configured such that each elongated shutter member moves at least partially through the heating plane between adjacent ones of the heating elements while moving between the retracted position and the extended position for that shutter member.

44. The method of claim 39 including the step of forming a support arrangement for supporting said heating elements having a surface facing the heating arrangement, said support arrangement further formed to define a plurality of elongated shutter slots each of which includes a shutter opening, defined in said surface, such that each of said slots is configured for at least partially receiving one of the elongated shutter members in said retracted position.

45. The method of claim 44 wherein said support arrangement is formed to include a thickness that is normal to said surface and to define, through said thickness, a plurality of through holes, each of which includes an aperture formed in said surface for use in gas cooling said heating elements.

46. The method of claim 44 wherein said support arrangement is formed to include a thickness that is normal to said surface and to define, within said thickness, at least one cooling channel for containing a cooling fluid within the cooling channel.

47. The method of claim 44 wherein each of said elongated shutter members is configured to include a pair of opposing ends defining an elongation length therebetween and including the step of supporting each opposing end using a hinge arrangement including a hinging arm that is hingably connected with said support arrangement such that each elongated shutter member moves rotatably between its retracted position and its extended position.

48. The method of claim 30 wherein each elongated shutter member, in the extended position, is locatable, at least in part, between the heating plane and the workpiece to cooperate with other ones of the shutter members for blocking said direct radiation.

49. The method of claim 39 wherein each elongated shutter member is configured as arcuate in cross-section in a plane that is transverse to an elongated dimension of each elongated shutter member.

50. The method of claim 49 wherein each elongated shutter member is further configured to include a leading edge and a trailing edge, and the leading edge of a particular elongated shutter member is proximate to an adjacent one of the elongated shutter members in said extended positions along a line of proximity that is between the leading edge and the trailing edge of the adjacent elongated shutter member.

51. The method of claim 49 wherein the line of proximity is adjacent to the trailing edge of the adjacent shutter.

52. The method of claim 39 wherein each elongated shutter member is configured to include a leading edge and a trailing edge such that the leading edge confronts the heating arrangement at least with the shutter in said retracted position and including the step of forming said leading edge to include a reflective coloration.

53. The method of claim 39 wherein each elongated shutter member is formed having an inner surface which confronts said heating elements in said extended positions and including the step of supporting a reflective material on said inner surface of at least one shutter.

54. The method of claim 39 wherein each elongated shutter member includes an outer surface which confronts said workpiece in said extended position and said outer surface of at least one shutter includes a radiation absorbing coloration.

55. The method of claim 39 wherein said elongated shutter members are supported for rotating at least partially around respective ones of the elongated heating elements in moving between the retracted positions and the extended positions.

56. The method of claim 39 including the step of arranging successive ones of said elongated shutter members to move between alternate adjacent ones of the elongated heating elements.

57. The method of claim 39 including the step of forming each of said elongated shutter members as a generally rectangular planar plate having a pair of opposing major surfaces with a thickness therebetween and having a pair of opposing ends defining said shutter elongation dimension therebetween and including the step of configuring moving means to include a pair of control arms, one pair of which is positioned at each opposing end of each elongated shutter member, and each of which control arms includes a control arm end that is pivotally attached to one of the elongated shutter members such that a controlled movement of each pair of control arms causes a pivotally attached one of the elongated shutter members to pivotally rotate, with respect to that pair of control arms, in moving between said retracted position and said extended position.

58. The method of claim 38 wherein said moving means is configured for moving all of said segments in unison between said retracted positions and said extended positions.

59. The method of claim 38 wherein said heating arrangement is provided including said array of heating elements in a side-by-side relationship and moving each of said segments along an extension direction from a retracted position through said array of heating elements when moving from said retracted positions to said extended positions.

60. The method of claim 59 wherein said extension direction is at least generally toward said workpiece from the retracted positions and configuring each of said segments as a shutter member for extension toward said workpiece from said retracted position.

61. The method of claim 60 wherein each of said shutter members is formed as an at least generally planar plate defining a major plane and said extension direction is at least generally aligned with said major plane and toward said workpiece.

62. The method of claim 60 including forming each of said shutter members having a tubular configuration defining a shutter interior such that one of said heating elements is at least partially received within said shutter interior of each shutter member as each shutter member moves from said retracted position to said extended position.

63. The method of claim 62 wherein at least one of said shutter members is received within the shutter interior of another one of said shutter members.

64. The method of claim 62 wherein said tubular configuration is cylindrical.

65. The method of claim 38 wherein said moving means is configured for providing a controlled acceleration and deceleration of the segments moving between the retracted positions and the extended positions.

66. The method of claim 60 including arranging said heating elements in a series of concentric rings and configuring said shutter members concentrically in a tubular configuration such that from a center point of the array each successive one of the shutter members, outward from the center point, moves around a greater number of said concentric rings.

67. The method of claim 39 wherein each shutter member defines a shutter plane and said movement means is configured to extend and retract each shutter using linear movements toward and away, respectively, from the heating arrangement such that each shutter moves in its shutter plane.

68. The method of claim 67 wherein each shutter defines a pair of opposing major surfaces and including providing a radiation absorbing coloration on both of said opposing major surfaces of at least one shutter.

69. The method of claim 39 including arranging a reflector plate confronting said heating arrangement on a side thereof which is opposite of said workpiece and defining a plurality of elongated shutter slots in the reflector plate such that each shutter moves in one shutter slot during extension and retraction thereof.

70. The method of claim 69 wherein each shutter defines an overall exterior surface area and said method includes forming at least a selected one of said slots to define an interior periphery and further forming said reflector plate to define a plurality of bearing members in said selected slot for contacting a portion of said overall exterior surface area such that the overall exterior surface of the shutter, away from said bearing members, is spaced apart from the interior periphery of the selected slot in which it is received by approximately said bearing member thickness.

71. The method of claim 70 wherein said shutter is spaced apart from the slot so as to define a plurality of cooling channels through which a cooling gas can flow to provide cooling at least for the selected shutter.

72. In a system for processing a workpiece by applying controlled heat thereto, an apparatus comprising:
a heating arrangement for use in a confronting relationship with said workpiece to subject the workpiece to a direct radiation that is produced by the heating arrangement;
a radiation shield supported for pivotal movement between (i) a retracted position, at least partially on a side of said heating arrangement that is opposite from said workpiece to allow said direct radiation to reach the workpiece, and (ii) an extended position, between the heating arrangement and said workpiece, in which extended position the radiation shield serves to at least partially block said direct radiation from reaching the workpiece.

73. In a system for processing a workpiece by applying controlled heat thereto, a method comprising:
providing a heating arrangement for use in a confronting relationship with said workpiece to subject the workpiece to a direct radiation that is produced by the heating arrangement; and
supporting a radiation shield for selective pivotal movement between (i) a retracted position, at least partially on a side of said heating arrangement that is opposite from said workpiece to allow said direct radiation to reach the workpiece, and (ii) an extended position, between the heating arrangement and said workpiece, in which extended position the radiation shield serves to at least partially block said direct radiation from reaching the workpiece.

74. In a system for processing a workpiece by applying a controlled heat thereto, an apparatus comprising:
a heating arrangement including an array of spaced apart heating elements for use in a confronting relationship with said workpiece to subject the workpiece to a direct radiation that is produced by the heating arrangement; and
a segmented radiation shield including a plurality of segments supported for movement between (i) retracted positions, which allow said direct radiation to reach the workpiece, and (ii) extended positions, in which extended positions the plurality of segments cooperate in way which serves to block, at least in part, said direct radiation from reaching the workpiece and configured for moving at least certain ones of said segments of the radiation shield between adjacent ones of said heating elements in moving those certain segments between the retracted and extended positions.

75. In a system for processing a workpiece by applying a controlled heat thereto, a method comprising the steps of:
providing a heating arrangement including an array of spaced apart heating elements for use in a confronting relationship with said workpiece to subject the workpiece to a direct radiation that is produced by the heating arrangement; and
configuring a segmented radiation shield including a plurality of segments supported for movement between (i) retracted positions, which allow said direct radiation to reach the workpiece, and (ii) extended positions, in which extended positions the plurality of segments cooperate in way which serves to block, at least in part, said direct radiation from reaching the workpiece and configured for moving at least certain ones of said segments of the radiation shield between adjacent ones of said heating elements in moving those certain segments between the retracted and extended positions.

76. In a system for processing a workpiece, having a treatment width, by applying controlled heat thereto, an apparatus comprising:
a heating arrangement for use in a confronting relationship with the treatment width of said workpiece to subject the workpiece to a direct radiation that is produced by the heating arrangement and said heating arrangement includes an arrangement of heating elements;
a radiation shield including a plurality of members, supported for movement between (i) an open state to allow said direct radiation to reach the workpiece without producing shadowing thereon, and (ii) an extended state in which the radiation shield serves to block said direct radiation from reaching the workpiece such that each of said members moves a distance between the open state and the extended state which is less than said treatment width and wherein said radiation shield includes a plurality of segments, as said plurality of members, which cooperate to at least partially block said direct radiation in said extended state and which retract at least between selected adjacent ones of said heating elements in moving to said open state; and
means for moving the radiation shield between the open state and the extended state.

77. In a system for processing a workpiece, having a treatment width, by applying controlled heat thereto, a method comprising:
providing a heating arrangement including an arrangement of heating elements for use in a confronting relationship with the treatment width of said workpiece to subject the workpiece to a direct radiation that is produced by the heating arrangement;
configuring a radiation shield to include a plurality of members, supported for movement between (i) an open state to allow said direct radiation to reach the workpiece without producing shadowing thereon, and (ii) an extended state in which the radiation shield serves to block said direct radiation from reaching the workpiece such that each of said members moves a distance between the open state and the extended state which is less than said treatment width and wherein said radiation shield is configured including a plurality of segments, as said plurality of members, which cooperate to at least partially block said direct radiation in said extended state and which retract at least between selected adjacent ones of said heating elements in moving to said open state; and moving the radiation shield between the open state and the extended state.

78. In a system for processing a workpiece by applying controlled heat thereto, an apparatus comprising:

a heating arrangement for use in a confronting relationship with said workpiece to subject the workpiece to a direct radiation that is produced by the heating arrangement, said heating arrangement including a plurality of spaced apart heating elements defining a heating plane;

a radiation shield including a plurality of shield members that are supported for movement between (i) an open state to allow said direct radiation to reach the workpiece without producing shadowing thereon, and (ii) an extended state in which the shield members serve to at least partially block said direct radiation from reaching the workpiece such that the shield members move at least between adjacent ones of the heating elements such that the at least certain ones of said shield members move between adjacent ones of the heating elements in moving between said open state and said extended state; and means for moving the shield members between the open state and the extended state.

79. In a system for processing a workpiece by applying controlled heat thereto, a method comprising:

providing a heating arrangement for use in a confronting relationship with said workpiece to subject the workpiece to a direct radiation that is produced by the heating arrangement, said heating arrangement including a plurality of spaced apart heating elements defining a heating plane;

configuring a radiation shield to include a plurality of shield members that are supported for movement between (i) an open state to allow said direct radiation to reach the workpiece without producing shadowing thereon, and (ii) an extended state in which the shield members serve to at least partially block said direct radiation from reaching the workpiece such that the shield members move at least between adjacent ones of the heating elements such that at least certain ones of said shield members move between adjacent ones of the heating elements in moving between said open state and said extended state; and moving the shield members between the open state and the extended state.

\* \* \* \* \*